(12) United States Patent
Kato et al.

(10) Patent No.: US 11,085,113 B2
(45) Date of Patent: Aug. 10, 2021

(54) FILM FORMING METHOD AND RECORDING MEDIUM

(71) Applicant: TOKYO ELECTRON LIMITED, Tokyo (JP)

(72) Inventors: Hitoshi Kato, Oshu (JP); Shigehiro Miura, Oshu (JP); Hiroyuki Kikuchi, Oshu (JP); Katsuyoshi Aikawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 54 days.

(21) Appl. No.: 16/021,888

(22) Filed: Jun. 28, 2018

(65) Prior Publication Data

US 2018/0327906 A1 Nov. 15, 2018

Related U.S. Application Data

(62) Division of application No. 14/926,017, filed on Oct. 29, 2015, now Pat. No. 10,072,336.

(30) Foreign Application Priority Data

Oct. 31, 2014 (JP) .................................. 2014-223701

(51) Int. Cl.
  *C23C 16/52* (2006.01)
  *C23C 16/458* (2006.01)
  (Continued)

(52) U.S. Cl.
  CPC .......... *C23C 16/52* (2013.01); *C23C 16/4409* (2013.01); *C23C 16/4584* (2013.01);
  (Continued)

(58) Field of Classification Search
  CPC ..................................................... C23C 16/52
  See application file for complete search history.

(56) References Cited

U.S. PATENT DOCUMENTS 5,795,448 A   8/1998  Hurwitt et al.
6,183,615 B1* 2/2001  Yasar ................ H01L 21/67709
                                                   204/192.12

(Continued)

FOREIGN PATENT DOCUMENTS

CN    101826446 A    9/2010
JP    04302138 A    10/1992

(Continued)

*Primary Examiner* — Charlee J. C. Bennett
(74) *Attorney, Agent, or Firm* — Nath, Goldberg & Meyer; Jerald L. Meyer; Tanya E. Harkins

(57) ABSTRACT

A film forming apparatus includes a rotary table having a loading area at a first surface side thereof and revolving a substrate loaded on the loading area, a rotation mechanism rotating the loading area such that the substrate rotates around its axis, a processing gas supply mechanism supplying a processing gas to a processing gas supply area so that a thin film is formed on the substrate which repeatedly passes through the processing gas supply area the revolution of the substrate, and a control part configured to perform a calculation of a rotation speed of the substrate based on a parameter including a rotation speed of the rotary table to allow an orientation of the substrate to be changed whenever the substrate is positioned in the processing gas supply area, and to output a control signal for rotating the substrate at a calculated rotation speed.

5 Claims, 30 Drawing Sheets

(51) Int. Cl.
*C23C 16/455* (2006.01)
*H01L 21/687* (2006.01)
*H01J 37/32* (2006.01)
*C23C 16/44* (2006.01)
*H01L 21/67* (2006.01)

(52) U.S. Cl.
CPC .. *C23C 16/45542* (2013.01); *C23C 16/45544* (2013.01); *C23C 16/45551* (2013.01); *H01J 37/321* (2013.01); *H01J 37/32926* (2013.01); *H01L 21/67253* (2013.01); *H01L 21/68764* (2013.01); *H01L 21/68771* (2013.01); *H01L 21/68792* (2013.01)

(56) References Cited

U.S. PATENT DOCUMENTS

| | | | |
|---|---|---|---|
| 6,524,449 B1 | 2/2003 | Folta et al. | |
| 6,592,675 B2* | 7/2003 | Nishikawa | C23C 16/4584 118/500 |
| 2010/0227059 A1* | 9/2010 | Kato | C23C 16/45551 427/255.28 |
| 2011/0139074 A1* | 6/2011 | Kato | C23C 16/45578 118/730 |
| 2011/0214611 A1* | 9/2011 | Kato | C23C 16/45551 118/719 |
| 2012/0088030 A1* | 4/2012 | Kato | C23C 16/45551 427/255.5 |
| 2013/0153054 A1* | 6/2013 | Child | H01L 21/68764 137/343 |
| 2013/0180452 A1* | 7/2013 | Kato | C23C 16/45551 118/719 |
| 2015/0361553 A1* | 12/2015 | Murakawa | C23C 16/52 156/345.55 |
| 2016/0138159 A1* | 5/2016 | Kato | C23C 16/45551 118/730 |
| 2017/0218514 A1* | 8/2017 | Kato | H01J 37/32779 |
| 2018/0363134 A1* | 12/2018 | Honma | C23C 16/511 |

FOREIGN PATENT DOCUMENTS

| | | |
|---|---|---|
| JP | 10116789 A | 5/1998 |
| JP | 4817210 B2 | 9/2001 |
| JP | 2001254181 A | 9/2001 |
| JP | 5093162 B2 | 9/2010 |
| JP | 2010206025 A | 9/2010 |
| JP | 2011-171589 A | 9/2011 |
| JP | 2013206978 A | 10/2013 |

* cited by examiner

Evaluation test 1-1

Evaluation test 1-2

Evaluation test 1-3

Evaluation test 1-4

Evaluation test 2-1

Evaluation test 2-2

Evaluation test 2-3

Evaluation test 2-4

Evaluation test 3-1
20rpm

Evaluation test 3-2
60rpm

Evaluation test 3-3
120rpm

FILM FORMING METHOD AND RECORDING MEDIUM

CROSS-REFERENCE TO RELATED APPLICATION

This application claims the benefit of Japanese Patent Application No. 2014-223701, filed on Oct. 31, 2014, in the Japan Patent Office, the disclosure of which is incorporated herein in its entirety by reference.

TECHNICAL FIELD

The present disclosure relates to a film forming apparatus and a film forming method of forming a thin film by supplying a processing gas to the substrate, and a recording medium.

BACKGROUND

A film forming apparatus which performs an atomic layer deposition (ALD) method as a method of forming a thin film of silicon oxide ($SiO_2$) or the like on a substrate such as semiconductor wafer (hereinafter, referred to as "wafer") has been known. As an example of this type film forming apparatus, there is an apparatus which includes a processing chamber whose inside can be kept in a vacuum atmosphere and a rotary table mounting thereon a wafer and installed in the processing chamber. A gas nozzle for discharging a source gas that is a raw material for the silicon oxide or the like and a gas nozzle for discharging an oxidizing gas for oxidizing the source gas are arranged above the rotary table. A silicon oxide film is formed on a wafer in such a way that the wafer repeatedly and alternately passes through an adsorption area where the source gas is supplied and an oxidation area where the oxidizing gas is supplied, while revolving by the rotation of the rotary table.

In order to control the distribution of in-plane film thickness of the wafer in the ALD method, a distribution of the source gas adsorbed on the wafer needs to be controlled, and hence the number and locations of ejection holes of the gas nozzle for discharging the source gas are appropriately adjusted in the film forming apparatus. In addition, selecting a shape of the gas nozzle, an adjustment of a supply amount of a separation gas which is supplied to compart the adsorption area and the oxidation area, and an adjustment of a concentration of a carrier gas in the source gas are properly performed.

On the other hand, there is sometimes the case where an etching rate can be adjusted for each of a peripheral area and a center area of the wafer in an etching process performed on the wafer after the film forming process. In this case, since a uniform film thickness can be obtained on the circumferential area and the center area after the etching, a uniform film thickness needs to be obtained particularly along the circumferential direction of the wafer. However, due to the above-mentioned revolution of the wafer, each portion of the wafer repeatedly travels the same orbit that is separated from a rotation center of the rotary table by a predetermined distance. Accordingly, there is a possibility that a fluctuation of the distribution of the source gas in the adsorption area leads to a fluctuation of the film thickness on the wafer in a radial direction of the rotary table, and that this fluctuation of the film thickness can not be sufficiently controlled by the adjustment of the number and locations of the ejection holes or the like.

In a conventional film forming apparatus in which the wafer revolves, in order to improve the uniformity of the film thickness in the circumferential direction of the wafer, a mechanism is provided for changing an orientation of the wafer by lifting the wafer placed on the rotary table from the rotary table when the rotary table is stopped in a predetermined orientation and then placing the wafer on the rotary table again. However, in this type of film forming apparatus, the throughput may decrease because the rotary table is stopped for every change of the orientation of the wafer.

In another conventional film forming apparatuses in which the wafer revolves, a wafer loaded on a rotary table rotates on its axis while the rotary table rotates. However, the film forming apparatus does not particularly provide the number of rotations set for wafer rotation. When the number of rotations of the wafer is not appropriately set, the wafer rotation and the wafer revolution may be synchronized with each other. That is, when the wafer rotation and the wafer revolution are synchronized with each other, the wafer may pass through the adsorption area in the same orientation, thereby leading to an insufficient uniformity of the film thickness on the wafer in the circumferential direction.

SUMMARY

Some embodiments of the present disclosure provide a technology for improving the in-plane uniformity of film thickness in the circumferential direction on a substrate when performing a film forming process on a substrate loaded on a rotary table by revolving the substrate.

According to the present disclosure, there is provided a film forming apparatus of forming a thin film on a substrate by supplying a processing gas to the substrate, the film forming apparatus including: a rotary table disposed in a vacuum chamber and having a loading area formed at a first surface side of the rotary table, the rotary table configured to revolve the substrate loaded on the loading area; a rotation mechanism configured to rotate the loading area such that the substrate rotates around its axis; a processing gas supply mechanism configured to supply the processing gas to a processing gas supply area at the first surface side of the rotary table so that the thin film is formed on the substrate which repeatedly passes through the processing gas supply area for a plurality of times by the revolution of the substrate; and a control part configured to perform a calculation of a rotation speed of the substrate based on a parameter including a rotation speed of the rotary table to allow an orientation of the substrate to be changed whenever the substrate is positioned in the processing gas supply area, and to output a control signal for rotating the substrate at a calculated rotation speed.

According to the present disclosure, there is provided a method of forming a thin film on a substrate by supplying a processing gas to the substrate, the method including: loading the substrate on a loading area formed at a first surface side of a rotary table disposed in a vacuum chamber and revolving the substrate; rotating the loading area by a rotation mechanism to rotate the substrate; supplying the processing gas to a processing gas supply area at the first surface side of the rotary table by a processing gas supply mechanism so that the thin film is formed on the substrate which repeatedly passes through the processing gas supply area by a plurality of times; calculating a rotation speed of the substrate based on a parameter including a rotation speed of the rotary table to allow an orientation of the substrate to be changed whenever the substrate is positioned in the processing gas supply area, and rotating the substrate at a calculated rotation speed.

According to the present disclosure, there is provided a non-transitory computer-readable recording medium storing therein a computer program used in a film forming apparatus in which a thin film is formed on a substrate by supplying a processing gas to the substrate, wherein the computer program is configured to execute the above method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 for performing an ALD on a substrate such as a wafer is described below. The apparatus 1 is an example of a vacuum processing apparatus according to the present disclosure. In the film forming apparatus 1, BTBAS (Bis (tertiary-butyl-amino) silane) gas as a source gas that is a processing gas including Si (silicon) is adsorbed on a wafer W, a molecular layer of $SiO_2$ (silicon oxide) is formed by supplying an ozone ($O_3$) gas as an oxidizing gas for oxidizing the adsorbed BTBAS gas, and the molecular layer is exposed to a plasma generated from a gas for generating the plasma. This series of processes is repeatedly performed by a plurality of times to form a $SiO_2$ film on the wafer W.

Figure 1:
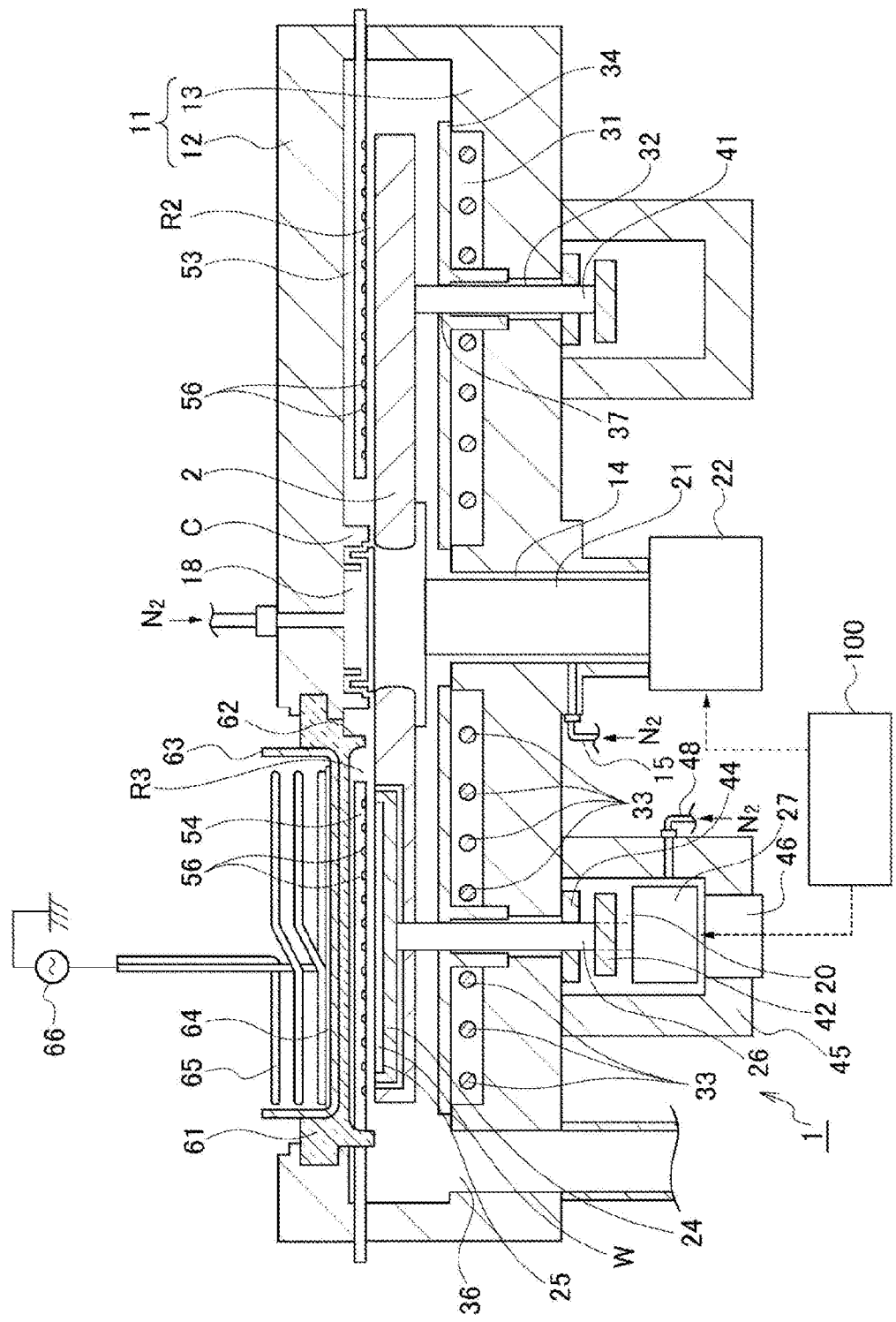
FIG. 1 is a longitudinal cross-sectional view of a film forming apparatus according to the present disclosure.
Figure 2:
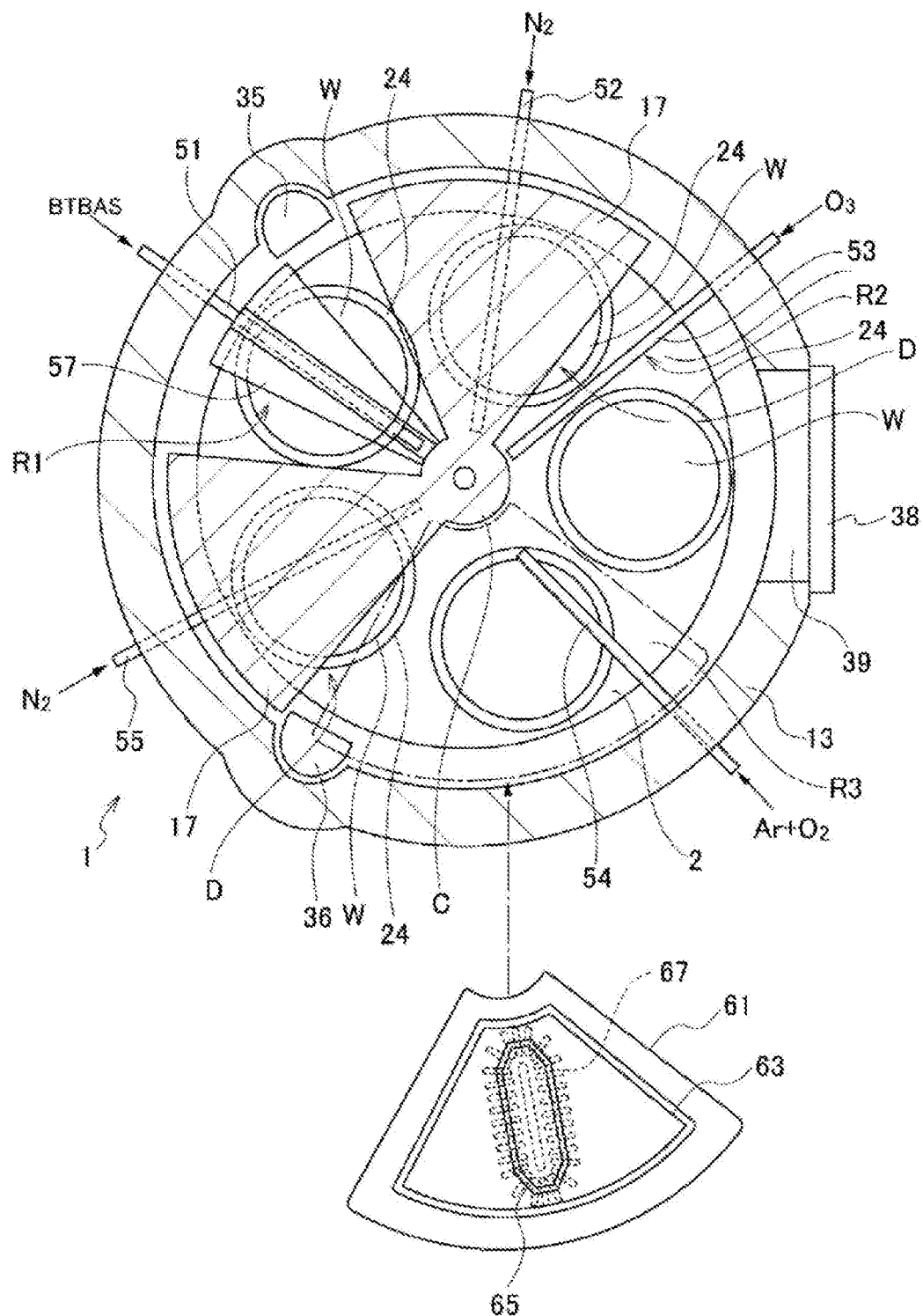
FIG. 2 is a plan view of the film forming apparatus shown in FIG. 1.

FIGS. 1 and 2 are a longitudinal cross-sectional view and a plan view of the film forming apparatus 1, respectively. The film forming apparatus 1 includes a vacuum chamber (processing chamber) 11 that is substantially circular and flat in shape, and a rotary table (susceptor) 2 having circular disk-shape and horizontally disposed in the vacuum chamber 11. The vacuum chamber 11 includes a ceiling plate 12 and a chamber body 13 that defines a side wall and a bottom portion of the vacuum chamber 11.

A center shaft 21 is installed extending from the center portion of the rotary table 2 in a vertical downward direction. The center shaft 21 is coupled to a rotation driving part 22 provided to block an opening portion 14 formed on the bottom portion of the chamber body 13. The rotary table 2 is supported by the center shaft 21 and the rotation driving part 22 in the vacuum chamber 11, and rotates in a clockwise direction when seen in a plan view. A gas supply pipe 15 shown in FIG. 1 discharges an $N_2$ (nitrogen) gas into a gap between the center shaft 21 and the chamber body 13, and serves to prevent the source gas and oxidizing gas from being introduced to a rear surface of the rotary table 2 from a front surface of the rotary table 2 by discharging the $N_2$ gas in processing the wafer W.

Further, a center area forming portion C protruding to face the center portion of the rotary table 2 and having a circular shape when seen in a plan view, and protrusions 17 each having a fan shape when seen in a plan view such that the protrusion 17 are formed to have a more widened width along a direction from the center area forming portion C toward a radially outward position of the rotary table 2 are formed on a bottom surface of the ceiling plate 12 of the vacuum chamber 11. That is, the center area forming portion C and the protrusions 17 constitute a lower ceiling surface compared with other areas. A gap between the center area forming portion C and the center portion of the rotary table 2 forms a flow path 18 for the $N_2$ gas. The $N_2$ gas is supplied to the flow path 18 from a gas supply pipe coupled to the ceiling plate 12 when processing the wafer W, and then discharged toward the entire outer circumference of the rotary table 2 from the flow path 18. The $N_2$ gas prevents the source gas and the oxidizing gas from being mixed with each other over the center portion of the rotary table 2.

Figure 3:
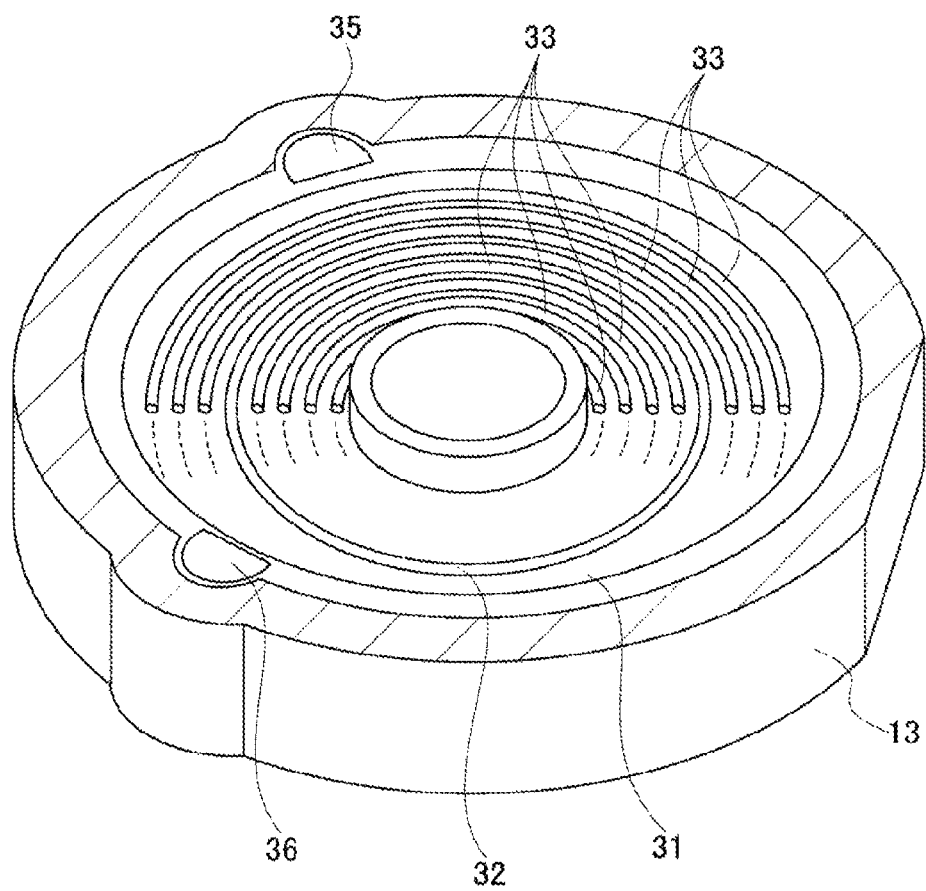
FIG. 3 is a perspective view of an inside of the film forming apparatus shown in FIG. 1.

FIG. 3 is a perspective view of a bottom of an inside of the chamber body 13. A concave portion 31 having a flat ring shape is formed on the chamber body 13 on the lower side of the rotary table 2 along the circumference of the rotary table 2. A slit 32 having a ring shape is opened on a bottom surface of the concave portion 31 along a circumferential direction of the concave portion 31. The slit 32 is formed to penetrate through the bottom portion of the chamber body 13 in a thickness direction. A heater 33 for heating the wafer W loaded on the rotary table 2 is arranged in a form of seven rings on a bottom surface of the concave portion 31. In FIG. 3, the heater 33 is shown by cutting away some portions thereof for the sake of simplicity.

The heater 33 is arranged along concentric circles centered at a rotation center of the rotary table 2, and among the seven heaters 33, four heaters are arranged on the inner side of the slit 32 and three heaters are arranged on the outer side of the slit 32. Further, a shield 34 is provided to cover an upper side of each heater 33 and to shield an upper side of the concave portion 31 (see FIG. 1). The shield 34 includes a slit 37 having a ring shape aligned with the slit 32, and a rotation shaft 26 and a strut 41, which will be described later, penetrate through the slit 37. Evacuation ports 35 and 36 for evacuating the vacuum chamber 11 are provided on an outer side of the concave portion 31 at the bottom portion of the chamber body 13. An evacuation mechanism (not shown) including a vacuum pump or the like is coupled to the evacuation ports 35 and 36.

The rotary table 2 is further described with reference to FIGS. 4 and 5 respectively illustrating an upper side and a lower side thereof. Five circular concave portions are formed along a rotational direction of the rotary table 2 on the frontal surface side (one surface side) of the rotary table 2, and a circular wafer holder 24 is provided on each of the concave portions. A recess portion 25 is formed on a frontal surface of the wafer holder 24, and the wafer W is horizontally placed on the recess portion 25. Accordingly, the bottom of the recess portion 25 defines a loading area where the wafer is loaded. In this example, a height of a side wall of the recess portion 25 is similar to a thickness of the wafer W, e.g., 1 millimeter.

For example, three struts 41 extend in a vertically downward direction from locations separated from each other in a circumferential direction of the rear surface of the rotary table 2, and as shown in FIG. 1, a lower portion of each of the struts 41 penetrates the bottom portion of the chamber body 13 through the slit 32 and is coupled to a support ring 42 that is a coupling part arranged on the lower side of the chamber body 13. The support ring 42 is formed along the rotational direction of the rotary table 2, while being horizontally arranged and suspended from the chamber body 13 by the strut 41. The support ring 42 rotates with the rotary table 2. The struts 41, the support 42, and the shield ring 44 constitute a support member.

The rotation shaft 26 that serves as a rotational axis extends in a vertically downward direction from the lower-side center portion of the wafer holder 24. A lower portion of the rotation shaft 26 penetrates the rotary table 2, penetrates the bottom portion of the chamber body 13 through the slit 32, as shown in FIG. 1, further penetrates the support ring 42 and a magnetic sealing part 20 provided on the lower side of the support ring 42, and coupled to a rotation driving part 27 for wafer rotation. The magnetic sealing part 20 includes a bearing for rotatably supporting the rotation shaft 26 against the support ring 42 and a magnetic seal (magnetic fluid seal) sealing a gap around the rotation shaft 26.

The magnetic seal is provided such that a particle originating from the bearing, e.g., a lubricant used for the bearing is suppressed from being spread to a vacuum atmosphere outside the magnetic sealing part 20. By supporting the rotation shaft 26 with the bearing, the wafer holder 24 is slightly upwardly separated from, e.g., the rotary table 2. The rotation driving part 27 for the wafer rotation includes a motor and is disposed in the lower side of the support ring 42 via the magnetic sealing part 20 to rotate the rotation shaft 26 about an axis thereof using the motor. When the rotation shaft 26 is rotated and supported in this manner, the wafer holder 24 rotates in a counterclockwise direction when seen, for example, in a plan view.

The wafer W rotates (wafer revolution) around the center shaft of the rotary table 2 due to the rotation of the rotary table 2, and the wafer W rotates around the center of the wafer W due to the rotation of the wafer holder 24. The rotation of the wafer W around the center of the wafer W may be referred to as a rotation of a wafer. In the film forming apparatus 1, the revolution and the rotation of the wafer W are performed in parallel when forming a thin film on the wafer W. The rotation of the wafer W includes an intermittent rotation around the center of the wafer W, as well as a continuous rotation around the center of the wafer W. In the case of the intermittent rotation, the rotation of the wafer W includes a case where the rotation of the wafer W is stopped before completing one rotation or more around the center of the wafer W and then the rotation is resumed.

Figure 4:
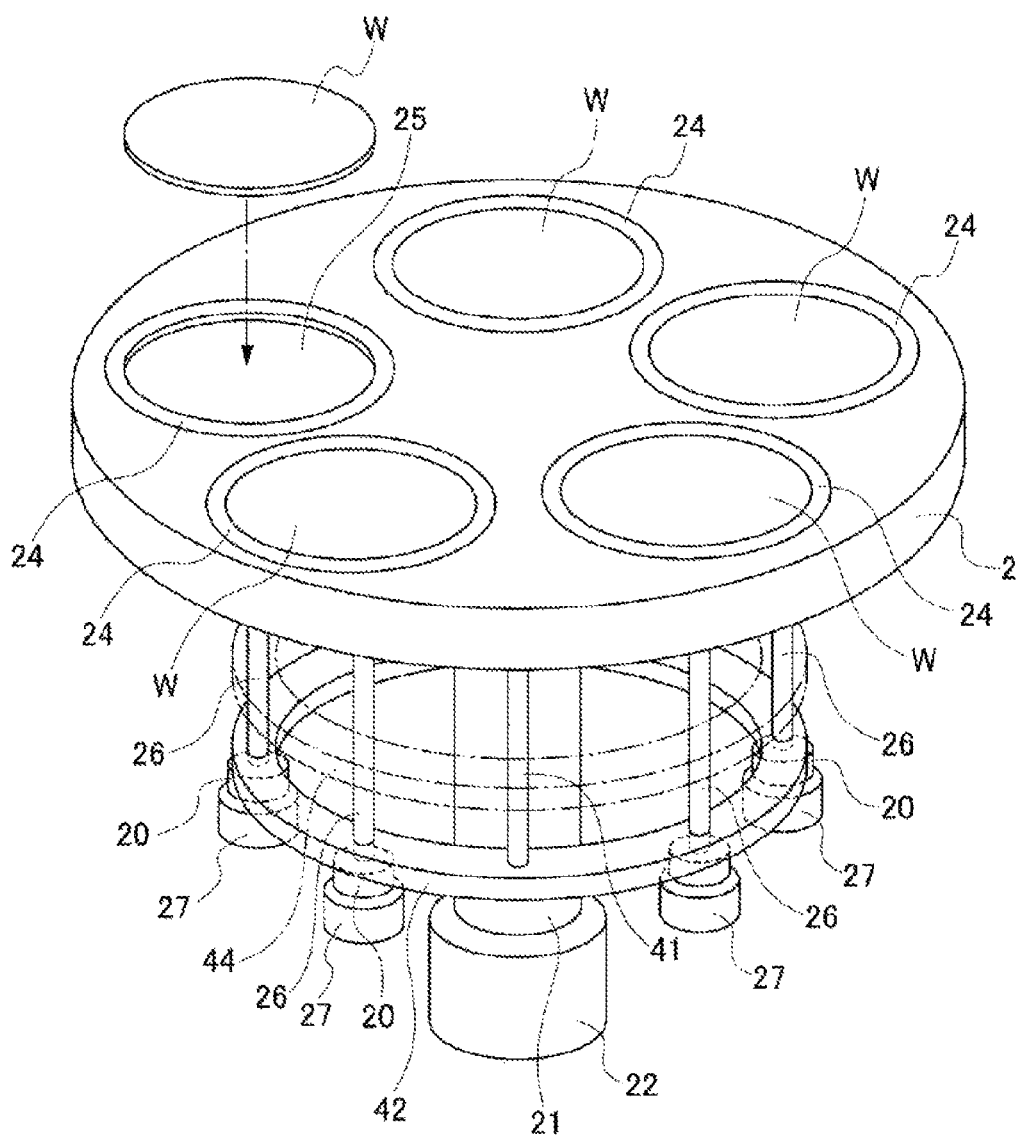
FIG. 4 is a perspective view of an upper-side rotary table of the film forming apparatus shown in FIG. 1.
Figure 5:
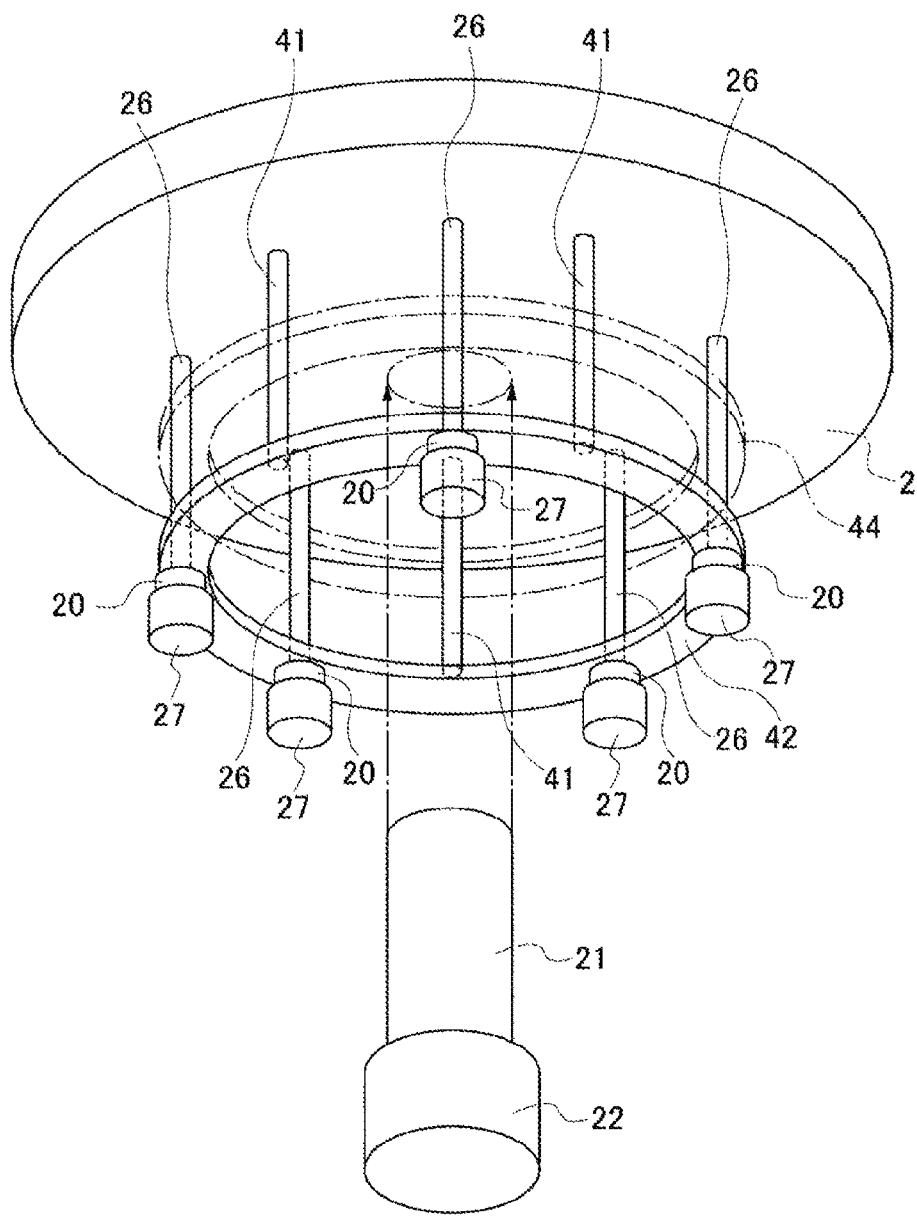
FIG. 5 is a perspective view of a lower-side of the rotary table.

A shield ring 44 is disposed so as to be overlapped with the support ring 42, and in FIGS. 4 and 5, the shield ring 44 is shown in a dotted and dashed line for the sake of brevity. As shown in FIG. 1, the shield ring 44 is provided to block the slit 32 of the chamber body 13 from the lower side of the chamber body 13, and is configured to rotate with the rotary table 2. Therefore, the rotation shaft 26 and the strut 41 are arranged to penetrate the shield ring 44. The shield ring 44 serves as a heat shielding member for preventing the rotation driving part 27 from being exposed to each gas and from being excessively heated.

As shown in FIG. 1, a lower side wall portion 45 which is formed in a concave shape when seen in a cross-sectional view and surrounds the support ring 42, the rotation driving part 27 for the wafer rotation, and the shield ring 44, is formed in a ring shape along the rotational direction of the rotary table 2 on the lower side of the chamber body 13. Further, five charging mechanisms 46 (only one charging mechanism 46 is shown in FIG. 1) are arranged on the bottom portion of the lower side wall portion 45 while being separated in the circumferential direction. When the processing is not performed on the wafer W, the rotary table 2 stops such that the rotation driving part 27 is located right above the charging mechanism 46, and each of the rotation driving parts 27 is charged by the charging mechanism 46 in a manner of a non-contact power supply. Each of the charging mechanisms 46 is arranged by considering such a function. A gas supply path 47 is provided in a space surrounded by the lower side wall portion 45. A gas nozzle 48 is provided to supply an $N_2$ gas, for example, while the wafer W is being processed, into the space surrounded by the lower side wall portion 45 through the gas supply path 47, to purge the space. Although not shown in FIG. 1, for example, the space is connected to an evacuation path for connecting the evacuation ports 35 and 36 with the evacuation mechanism (not shown), as will be described later by raising an example, and hence even when a particle is generated in the space, the particle is purged and removed to the evacuation path by the $N_2$ gas.

A transfer port 39 for transferring the wafer W and a gate valve 38 for opening/closing the transfer port 39 are provided in a side wall of the chamber body 13 (see FIG. 2), and a delivery of the wafer W is performed between a transfer device introduced into the vacuum chamber 11 through the transfer port 39 and the recess portion 25. Specifically, through holes are formed at respective positions of the bottom surface of the recess portion 25, the bottom portion of the chamber body 13, and the rotary table 2, and leading ends of pins are configured to move up and down through each through hole between the space above the recess portion 25 and the lower side of the chamber body 13. The delivery of the wafer W is performed by the pin. The pin and each through hole through which the pin penetrates are omitted in the drawings.

Further, as shown in FIG. 2, a source gas nozzle 51, a separation gas nozzle 52, an oxidizing gas nozzle 53, a plasma generation gas nozzle 54, and a separation gas nozzle 55 are arranged at intervals over the rotary table 2 in this order in the rotational direction of the rotary table 2. Each of the gas nozzles 51 to 55 is formed in a rod shape extending horizontally along the radial direction of the rotary table 2 from the side wall toward the center portion of the vacuum chamber 11, and discharges a corresponding gas in a downward direction from a plurality of discharge holes 56 formed along the radial direction.

The source gas nozzle 51 constituting a processing gas supply mechanism discharges the BTBAS (Bis (tertiary-butyl-amino) silane) gas. A nozzle cover 57 shown in FIG. 2 covers the source gas nozzle 51, which is formed in a fan shape extending toward upstream side and downstream side of the rotational direction of the rotary table 2. The nozzle cover 57 serves to improve adsorption of the BTBAS gas onto the wafer W by increasing the concentration of the BTBAS gas on a lower side of the nozzle cover 57. The oxidizing gas nozzle 53 discharges an ozone gas. The separation gas nozzles 52 and 55 are gas nozzles for discharging an $N_2$ gas, and each is arranged to divide the fan-shaped protrusion 17 of the ceiling plate 12 in a circumferential direction.

The plasma generation gas nozzle 54 discharges a plasma generation gas including a mixed gas of, for example, an argon (Ar) gas and an oxygen ($O_2$) gas. An opening portion having a fan shape extending in the rotational direction of the rotary table 2 is formed through the ceiling plate 12, and a plasma forming part 61 having a cup shape corresponding to a shape of the opening portion and made of a dielectric material such as quartz is provided to block the opening portion. The plasma forming part 61 is arranged between the oxidizing gas nozzle 53 and the protrusion 17 in the rotational direction of the rotary table 2. In FIG. 2, a position where the plasma forming part 61 is arranged is shown in a dotted and dashed line.

A protruding portion 62 is formed on a bottom surface of the plasma forming part 61 along a peripheral portion of the plasma forming part 61, and a leading end portion of the plasma generation gas nozzle 54 penetrates the protruding portion 62 from an outer circumferential side of the rotary table 2 in order to allow the gas to be discharged in an area surrounded by the protruding portion 62. The protruding portion 62 serves to suppress a decrease of the concentration of the plasma generation gas by preventing the $N_2$ gas, the ozone gas, and the BTBAS gas from entering into the lower side of the plasma forming part 61.

A recess portion is formed in an upper side of the plasma forming part 61, and a Faraday shield 63 having a box shape opened upwards is arranged in the recess portion. An antenna 65 including a metal wire wound in a coil shape around a vertical axis is provided on a bottom surface of the Faraday shield 63 via an insulating plate member 64, and a radio frequency (RF) power source 66 is connected to the antenna 65. A slit 67 is formed on the bottom surface of the Faraday shield 63, for preventing an electric field component of an electromagnetic field generated from the antenna 65 when applying an RF power to the antenna 65 from being directed downwards while causing a magnetic field component to be directed downwards. The slit 67 extends in a direction perpendicular to (intersecting with) a winding direction of the antenna 65, and a plurality of slits 67 is formed along the winding direction of the antenna 65. With this configuration, when the RF power source 66 is turned on and the RF power is applied to the antenna 65, plasma is generated from the plasma generation gas supplied to the lower side of the plasma forming part 61.

Above the rotary table 2, an area below the nozzle cover 57 of the source gas nozzle 51 is defined as an adsorption area R1 where an adsorption of the BTBAS gas which is a source gas is performed, and an area below the oxidizing gas nozzle 53 is defined as an oxidizing area R2 where an oxidation of the BTBAS gas by the ozone gas is performed. Further, an area below the plasma forming part 61 is defined as a plasma forming area R3 where a modification of the $SiO_2$ film is performed by plasma. Areas below the protrusions 17 respectively define separation areas D for preventing the source gas and the oxidizing gas from being mixed by separating the adsorption area R1 and the oxidizing area R2 from each other by the $N_2$ gas discharged from the separation gas nozzles 52 and 55.

The evacuation port 35 is opened at a radially outward position between the adsorption area R1 and the separation area D near the downstream side of the adsorption area R1 in the rotational direction, and a surplus BTBAS gas is exhausted through the evacuation port 35. The evacuation port 36 is opened at a radially outward position near a boundary between the plasma forming area R3 and the separation area D near the downstream side of the plasma forming area R3 in the rotational direction, and a surplus $O_3$ gas and plasma generation gas are exhausted through the evacuation port 36. The $N_2$ gases supplied from of the separation area D, the gas supply pipe 15 on the lower side of the rotary table 2, and the center area forming portion C are also exhausted through the evacuation ports 35 and 36.

The film forming apparatus 1 includes a control part 100 implemented by a computer to perform an operation control of the entire apparatus (see FIG. 1). A program for executing a film forming process described later is stored in the control part 100. The program controls an operation of each part by sending a control signal to the parts of the film forming apparatus 1. Specifically, a supply amount of the gas from each of the gas nozzles 51 to 56, a temperature of the wafer W by the heater 33, supply amounts of the $N_2$ gases from the gas supply pipe 15 and the center area forming portion C, a rotation speed of the rotary table 2 by the rotation driving part 22, a rotation speed of the wafer holder 24 by the rotation driving part 27 for the wafer rotation, and the like are controlled based on the control signal. In the program, a group of steps is prepared such that each process described later can be executed by performing such a control. The program is installed in the control part 100 from a recording medium such as a hard disk, a compact disk, an optomagnetic disk, a memory card, a flexible disk, or the like.

In the film forming apparatus 1, the process is started with the rotation of the rotary table 2 so that the wafer W revolves around the center of the rotary table 2. The rotation of the wafer W is performed by the rotation of the wafer holder 24 in parallel with the rotation of the rotary table 2. However, the rotation of the rotary table 2 and the rotation of the wafer holder 24 are not synchronized with each other. More specifically, the wafer W rotates at a certain rotation speed so that, when the rotary table 2 makes one rotation from a predetermined position in the vacuum chamber 11 in which the wafer W is positioned in a first orientation and stops at the predetermined position again, the wafer W can be positioned in a second orientation different from the first orientation. The rotation speed A (unit: rpm) of the wafer W is set by the control part 100 based on a parameter inputted by an operator.

Figure 6:
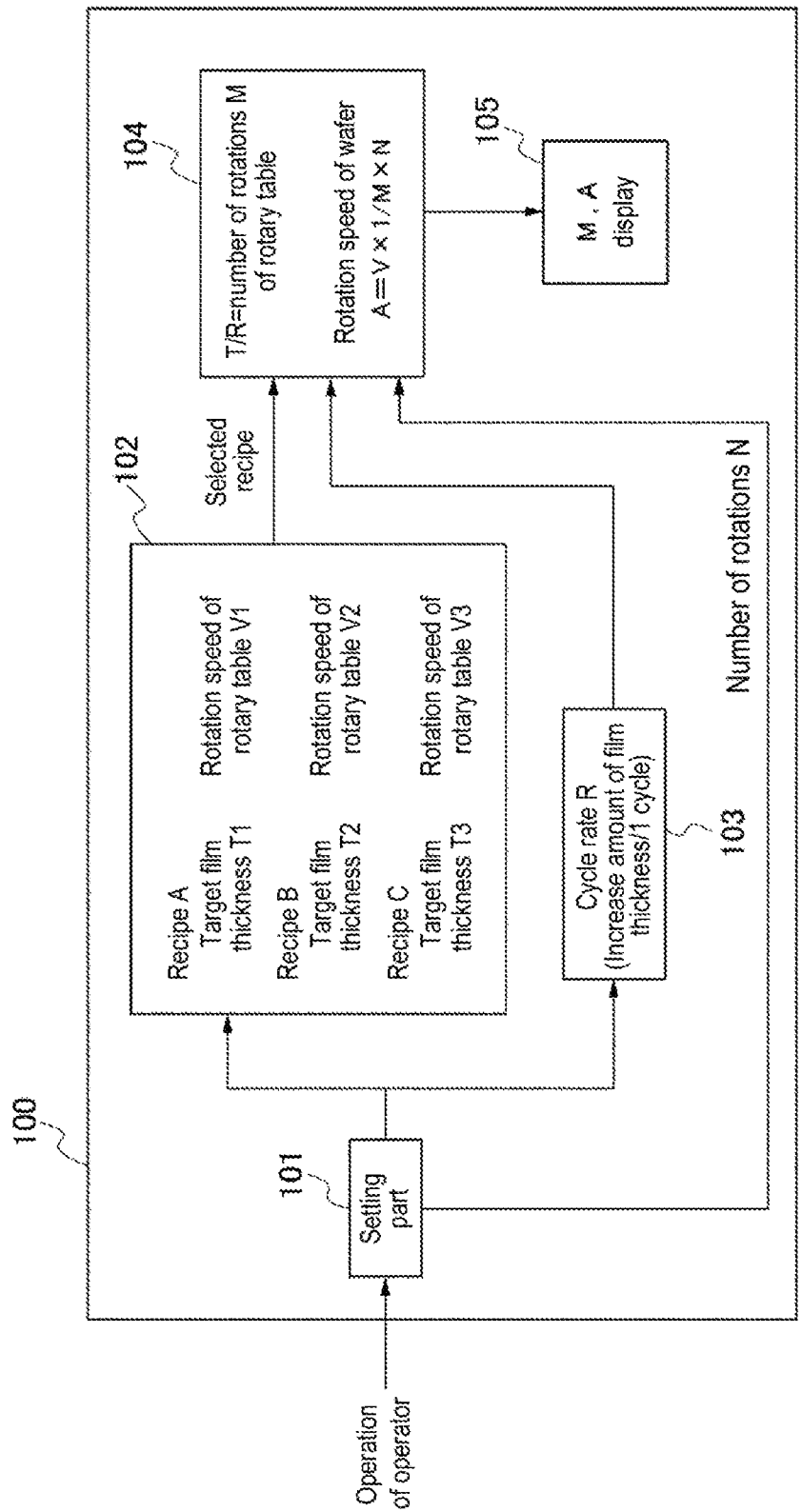
FIG. 6 is a block diagram of a control part of the film forming apparatus shown in FIG. 1.
Figure 7:
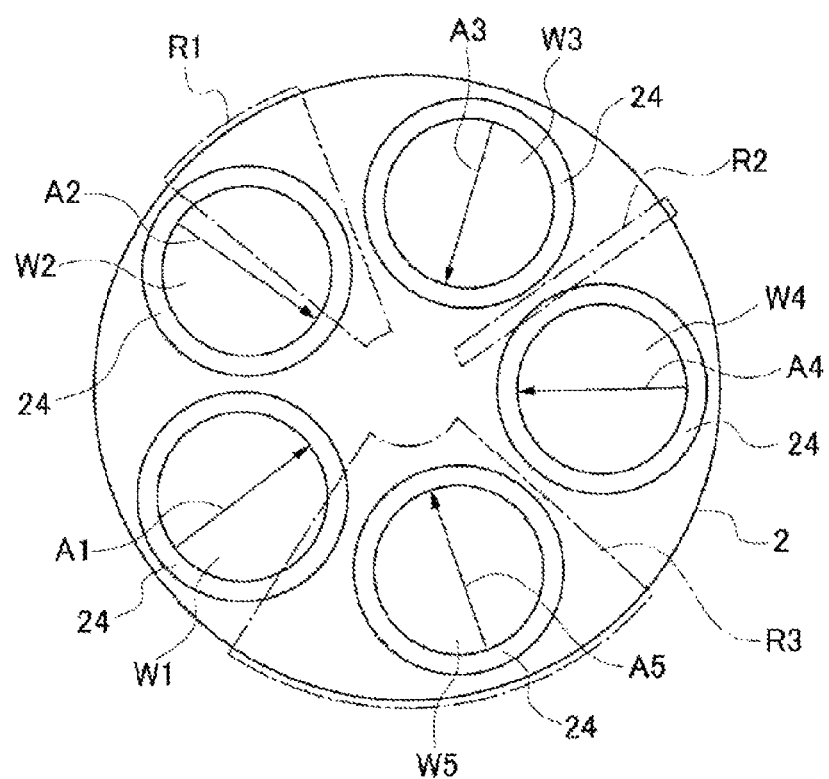
FIGS. 7 to 10 are explanatory diagrams for illustrating position and orientation of a wafer during a film forming process.

The control part 100 is further described with reference to FIG. 6, which is a block diagram of the control part 100. The control part 100 includes a setting part 101 that includes an operation panel with a button and the like for the operator to input and set the parameter, a memory 102 that stores therein a plurality of processing recipes, and a memory 103 that stores therein a cycle rate R (unit: nm/cycle). The processing recipe is data including, for example, a target film thickness T (unit: nm) of a $SiO_2$ film to be formed on the wafer W, a flow rate of a gas supplied from each part of the film forming apparatus 1, and a rotation speed V (unit: rpm) of the rotary table 2, wherein three components are associated with one another. The cycle rate R is an increase amount of the film thickness obtained when one ALD cycle including a supply of the source gas, a supply of the oxidizing gas, and a modification of the film by the plasma is completed. That is, it is equivalent to an increase amount of the film thickness per rotation of the rotary table 2.

The control part 100 further includes a work memory 104 and a display part 105. Various parameters are input to the work memory 104 from the memories 102 and 103, and a calculation of the rotation speed of the wafer holder 24 is performed based on the parameters. A result of the calculation in the work memory 104 is displayed on the display part 105.

When the operator performs a predetermined operation on the setting part 101, one of the plurality of processing recipes is selected, and the target film thickness T and the rotation speed V of the rotary table 2 included in the selected processing recipe are loaded in the work memory 104 from the memory 102. Further, when the operator performs a predetermined operation on the setting part 101, the cycle rate R is loaded in the work memory 104 from the memory 103.

In the work memory 104, the number of rotations (T/R=M) of the rotary table 2 from the start of a film forming process to the end of the film forming process is calculated from the loaded target film thickness T and cycle rate R. At the time when the film forming process is started, both the rotation of the rotary table 2 and the supply of the gas from the source gas nozzle 51 are performed. At the time when the film forming process ends, at least one of the rotation of the rotary table 2 or the supply of the gas from the source gas nozzle 51 is stopped. The calculated number of rotations M of the rotary table 2 is displayed on the display part 105. The operator sets the number of rotations N (N is natural number) of the wafer holder 24 on the setting part 101 based on the displayed number of rotations M of the rotary table 2. The number of rotations N is the number of rotations of the wafer holder 24 from the start of the film forming process to the end of the film forming process.

As the number of rotations N, a numerical value different from a integer multiple of the number of rotations M of the rotary table 2 is set. This is for preventing a synchronization between the rotation of the rotary table 2 and the rotation of the wafer W. In some embodiments, N is an integer equal to or larger than one. This is because, although the wafer W passes through the source gas adsorption area R1 in various orientations by its rotation and revolution, it is important to increase the uniformity in the distribution of the film thickness along the circumferential direction of the wafer W by substantially equalizing the number of passes in each orientation.

When the number of rotations N is set, the rotation speed A of the wafer W is calculated from the number of rotations N, the rotation speed V of the rotary table 2, and the number of rotations of the rotary table 2. Specifically, a formula (the rotation speed A (rpm) of the wafer W=the rotation speed V (rpm) of the rotary table×1/M (times)×N) is calculated. The result of the calculation is displayed on the a screen (display part) 105. When the calculation of the rotation speed A is completed, it is determined whether or not the rotation speed of the wafer W is equal to or slower than a reference speed, e.g., 10 rpm. When it is determined that the rotation speed of the wafer W is equal to or slower than the reference speed, a message saying that the process is ready is displayed on the screen 105, and the operator can start the film forming process by performing a predetermined operation on the setting part 101. On the other hand, when it is determined that the rotation speed of the wafer W exceeds the reference speed, for example, a message saying that a re-setting of each parameter is required is displayed on the screen 105.

When the rotation speed A of the wafer W is high, the orientation of the wafer W during passing through the adsorption area R1 is largely changed, whereby improved uniformity in the distribution of the film thickness along the circumferential direction of the wafer W can be obtained regardless of the distribution of the source gas in the adsorption area R1. However, if the rotation speed A of the wafer W is too fast, the wafer W may be upwardly separated from the wafer holder 24 due to a centrifugal force and is likely to be deviated from the wafer holder 24. For this reason, in some embodiments, the rotation speed A of the wafer W is limited to be equal to or slower than the reference speed.

The calculation of the rotation speed A (rpm) of the wafer W is further described with a specific example. It is assumed that, for example, the target film thickness T and the rotation speed V of the rotary table 2 are 32 nm and 60 rpm, respectively, and the cycle rate R is 0.095 nm/cycle in the selected processing recipe. In the work memory 104, the number of rotations M of the rotary table 2 is calculated to be T/R=32 (nm)/0.095 (nm/cycle)≈337 rotations. When the number of rotations N of the wafer W is set, the rotation speed A (rpm) of the wafer W is calculated to be V (rpm)×1/M (rotations)×N=60×1/337×N≈0.178 rpm. Since the number of rotations M of the rotary table 2 is 337, a natural number other than 337 is set as the number of rotations N in order to prevent the synchronization described above. The above calculation and determination are performed by the program of the control part 100.

A film forming process on the wafer W by the film forming apparatus 1 is described below. As described with reference to FIG. 6, when the processing recipe is selected and the target film thickness T and the rotation speed of the rotary table 2 are set, the reading of the cycle rate R and the setting of the number of rotations N are performed and the rotation speed of the wafer W is set. The wafer W is then loaded on each wafer holder 24 by a transfer device (not shown) (see FIG. 7). A further description is given by appropriately referring to FIGS. 7 to 10 in which the wafer W loaded on the rotary table 2 is schematically shown. In FIGS. 7 to 10, each wafer W is represented by W1 to W5 for the sake of convenience. Further, in order to indicate an orientation of the wafer W that is changed during the film forming process, diameters of the wafers W1 to W5 that have not subjected to the film forming process are respectively represented by arrows A1 to A5 directed to the center of the rotary table 2 in an area corresponding to the diameter of the rotary table 2.

The gate valve 38 is closed after loading the wafers W1 to W5, the evacuation is performed through the evacuation ports 35 and 36 to cause the inside of the vacuum chamber 11 to be in a vacuum atmosphere of a predetermined pressure, and the $N_2$ gas is supplied to the rotary table 2 from the separation gas nozzles 52 and 55. Further, the $N_2$ gases as a purge gas are supplied from the center area forming portion C of the rotary table 2 and the gas supply pipe 15 at the lower side of the rotary table 2, and flow from the center portion of the rotary table 2 toward the peripheral portion of the rotary table 2. The temperature of the heater 33 rises and the rotary table 2 and the wafer holder 24 are heated by a radiant heat from the heater 33. Further, each of the wafers W1 to W5 is heated to a predetermined temperature by a heat transfer from the wafer holder 24.

Figure 8:
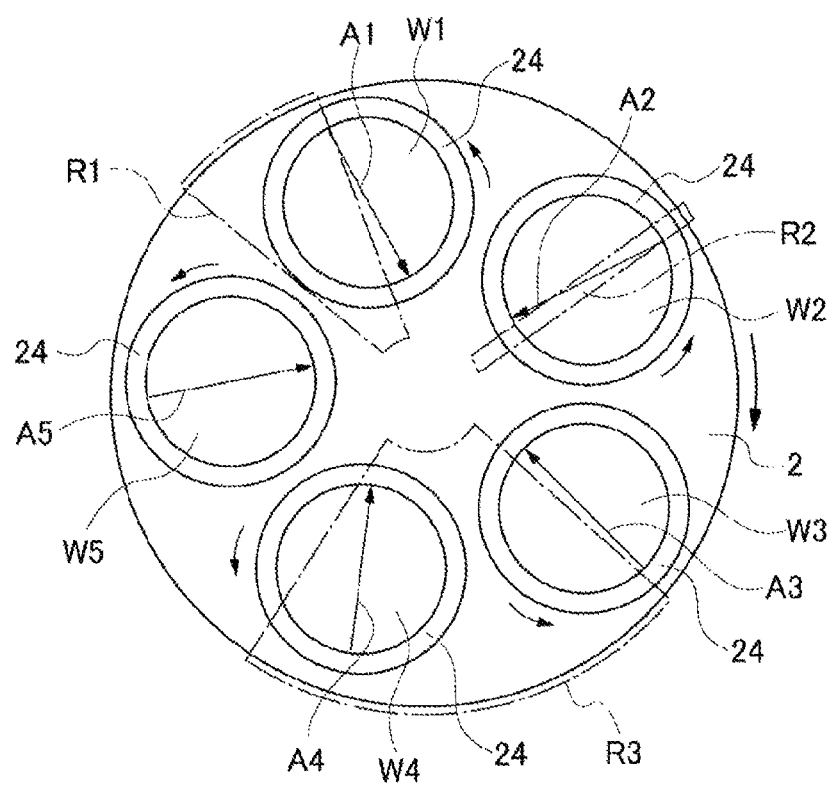

Thereafter, both the rotation of the rotary table 2 at the rotation speed V set by the operator and the rotation of the wafer holder 24 at the calculated rotation speed A of the wafer W are started. That is, the revolution and the rotation of the wafer W are started. For example, with the start of the revolution and the rotation, the supply of the gas from each of the source gas nozzle 51, the oxidizing gas nozzle 53, and the plasma generation gas nozzle 54, and the generation of the plasma by the application of the RF power to the antenna 65 from the RF power source 66 are started. Each of the gases is supplied at the flow rate specified in the selected processing recipe. FIG. 8 illustrates a state in which a predetermined time elapses since the film forming process is started, the rotary table 2 is rotated 180 degrees from the start of the film forming process, and the orientation of the wafer W is changed by the rotation.

Figure 11:
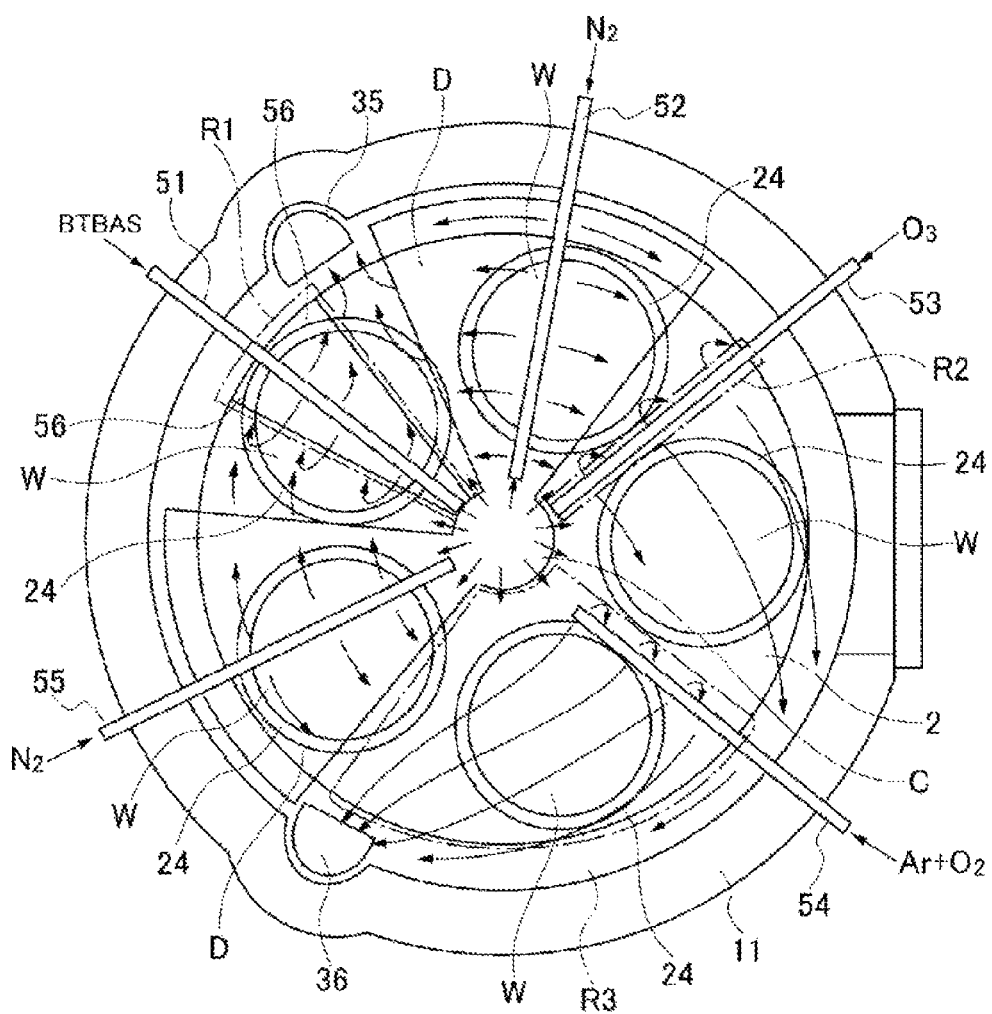
FIG. 11 is an explanatory diagram for illustrating flow of a gas over the rotary table during a film forming process.

The flow of each of the gases in the vacuum chamber 11 is indicated by an arrow in FIG. 11. Since the separation area D into which the $N_2$ gas is supplied is formed between the adsorption area R1 and the oxidizing area R2, the source gas supplied to the adsorption area R1 and the oxidizing gas supplied to the oxidizing area R2 are not mixed over the rotary table 2 and are evacuated with the $N_2$ gas through the evacuation port 35. Further, as the separation area D into which the $N_2$ gas is supplied is formed between the adsorption area R1 and the plasma forming area R3, the source gas, the plasma generation gas supplied to the plasma forming area R3, and the oxidizing gas heading for the separation area D from the upstream side of the plasma forming area R3 in the rotational direction are not mixed over the rotary table 2 and are evacuated with the $N_2$ gas from the evacuation port 36. The $N_2$ gas supplied from the center area forming portion C and the gas supply pipe 15 are also removed from the evacuation ports 35 and 36.

In a state in which the supply and the evacuation of each of the gases are performed in the above manner, the wafer W1 to W5 sequentially and repeatedly travels the adsorption area R1 below the nozzle cover 57 of the source gas nozzle 51, the oxidizing area R2 below the oxidizing gas nozzle 53, and the plasma forming area R3 below the plasma forming part 61 in this order. The BTBAS gas discharged from the source gas nozzle 51 is adsorbed on the wafer W in the adsorption area R1, and the adsorbed BTBAS gas is oxidized by the $O_3$ gas supplied from the oxidizing gas nozzle 53 in the oxidizing area R2, thus forming one or a plurality of molecular layers of silicon oxide. In the plasma forming area R3, the silicon oxide molecular layer is exposed to the plasma and modified.

Figure 9:
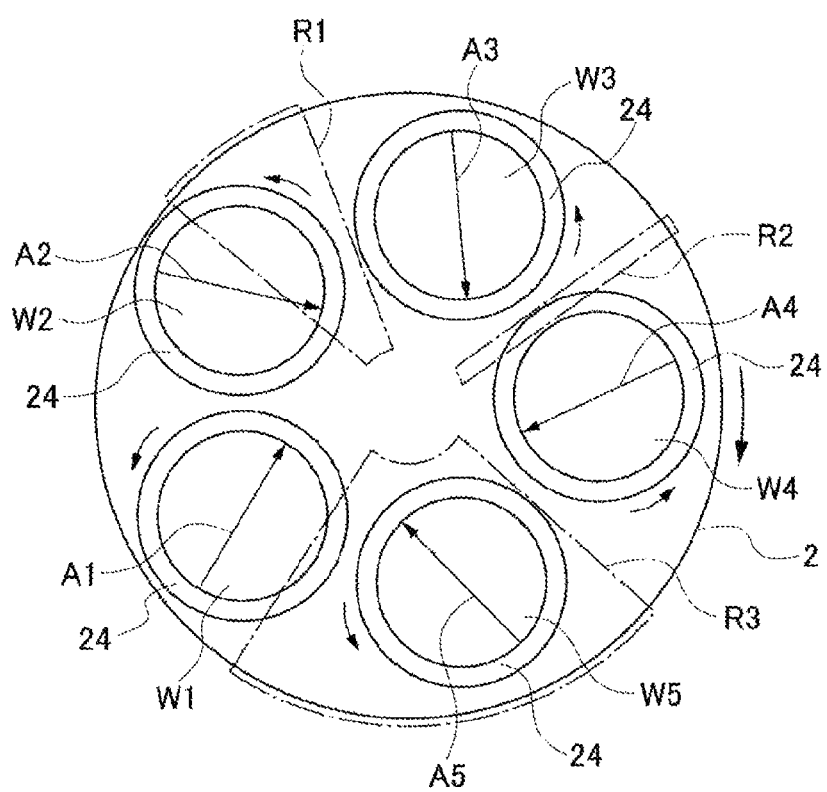
Figure 10:
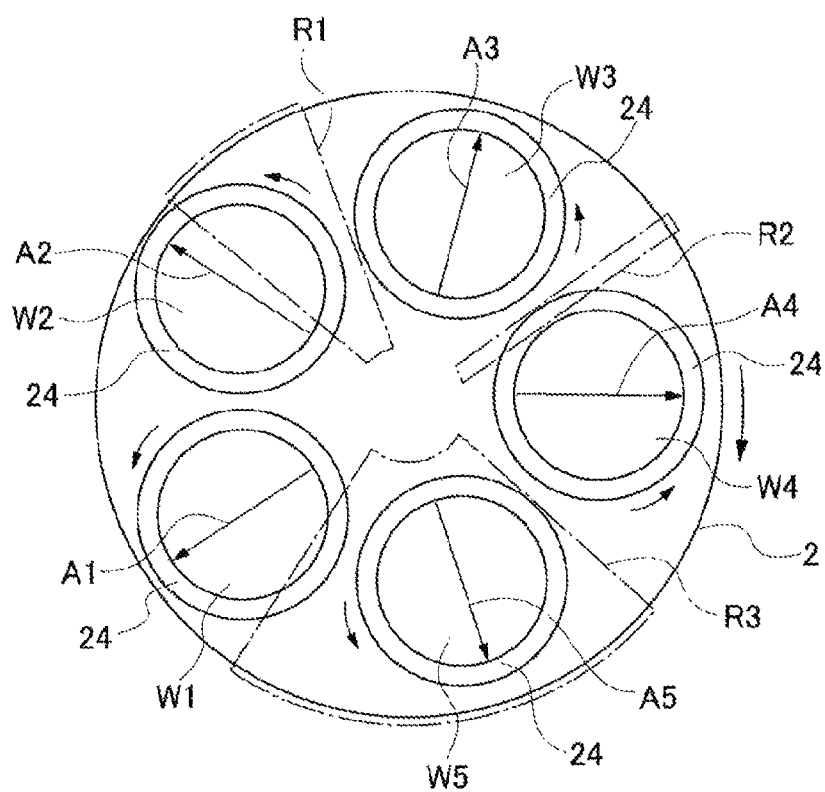

In the above manner, the wafer holder 24 rotates without being synchronized with the rotation of the rotary table 2, and hence each of the wafers W1 to W5 is positioned in a different orientation whenever it is located at a predetermined position in the adsorption area R1. FIG. 9 illustrates a state in which the rotary table 2 completes one rotation from the start of the film forming process. FIG. 10 illustrates a state in which the rotation of the rotary table 2 is continued from the state shown in FIG. 9 and each of the wafers W1 to W5 shows an orientation rotated 180 degrees from the orientation at the time of starting the film forming process. The change of the orientation of each of the wafers W1 to W5 causes each portion of the wafer W in the circumferential direction to pass a different position in the adsorption area R1. Hence, even when a distribution of concentration of the source gas at each of the positions in the adsorption area R1 is changed, the amount of source gas adsorbed on the wafer W from the start of the film forming process to the end of the film forming process can be equalized on each portion of the wafer W in the circumferential direction. Consequently, the thickness of the $SiO_2$ film formed on the wafer W can be suppressed from being unequally distributed on each portion of the wafer W in the circumferential direction.

A continued rotation of the rotary table 2 in the above manner causes the molecular layer of the silicon oxide to be sequentially laminated, so that a silicon oxide film is formed and its thickness is gradually increased. When the film forming process is completed while the target film thickness is obtained, i.e., when the rotary table 2 rotates by the number of rotations calculated based on the preset parameters, the rotation of the rotary table 2 and the rotation of the wafer holder 24 are stopped, and the film forming process is completed. At the time of ending the film forming process, each of the wafers W1 to W5 is located at the same position as that at the time of starting the film forming process, and since, as described with reference to FIG. 6, the number of rotations N is set as an integer, each of the wafers W1 to W5 has the same orientation as that at the time of starting the film forming process. Therefore, the wafers W1 to W5 are respectively positioned in orientations shown in FIG. 7. At the time of ending the film forming process, the supply of the gasses from the gas nozzles 51 to 55 and the generation of the plasma are also stopped. Thereafter, the wafers W1 to W5 are transferred out of the vacuum chamber 11 by the transfer device.

In the film forming apparatus 1, the rotation speed V of the rotary table 2, the target film thickness T of the $SiO_2$ film, the cycle rate R, and the number of rotations N of the wafer W are set as the parameter, the rotation speed A of the wafer W is calculated based on the set parameter to allow the wafer W to be positioned in a different orientation whenever the wafer W is located in the adsorption area R1, and the wafer W rotates at the calculated rotation speed A. Therefore, the uniformity of the film thickness of the $SiO_2$ film can be improved along the circumferential direction of the wafer W.

Further, in the film forming apparatus 1, the operator can freely set the number of rotations N in the above-described manner. When the number of rotations N becomes smaller, the change in orientation between the time when the wafer W is located in the adsorption area R1 and the next time the wafer is located in the adsorption area R1 becomes smaller. That is, a dispersion degree between the orientations of the wafer W whenever the wafer W is located in the adsorption area R1 becomes larger until the end of the film forming process. In other words, the film forming apparatus 1 has an advantage that the dispersion degree of the orientation can be easily and clearly set. In an example of setting N, N is set to an integer as described above, whereby the number of times the wafer W passes through the adsorption area R1 is allowed to be uniform for different orientations, and hence the uniformity of the film thickness in the circumferential direction can be improved more definitely. It is preferred that an integer is set as the number of rotations N of the wafer W. However, a number equal to or larger than one including a decimal may be set as the number of rotations N of the wafer W because an unequal distribution of the film thickness in the circumferential direction can be mitigated even in a case where a number including a decimal is set as the number of rotations N.

In addition, the film forming apparatus 1 is configured such that the rotation shaft 26 for supporting the wafer holder 24 is supported by the support ring 42 that is supported by the rotary table 2 via the strut 41, and the heater 33 is arranged on each of the inner side and the outer side of a traveling path of the strut 41 and the rotation shaft 26 traveling with the rotation of the rotary table 2. With this configuration, the wafer W can be heated through the rotary table 2 while the heater 33 does not interrupt the traveling of the strut 41 and the rotation shaft 26.

In the above-mentioned example, it is configured that the rotation speed V of the rotary table 2, the target film thickness T of the $SiO_2$ film, and the cycle rate R are loaded from the memories 102 and 103 to the work memory 104. However, in some embodiments, at least one of these parameters may be inputted by an operator from the setting part 101 to the work memory 104 for the calculation of the rotation speed A of the wafer W.

In one of the example configurations, an operator may set, from the setting part 101, the rotation speed V of the rotary table 2 and a coefficient K for determining the rotation speed A by being multiplied by V, and the rotation speed A of the wafer W is set at the work memory 104 from a calculation of A=V×K. As the coefficient K, a numerical value allowing the rotation of the wafer W not to be synchronized with the revolution of the wafer W is set, and the value is selected among, e.g., K=0.1, 0.2, 0.3 . . . , 1.1, 1.2, 1.3 . . . , and the like.

Figure 12:
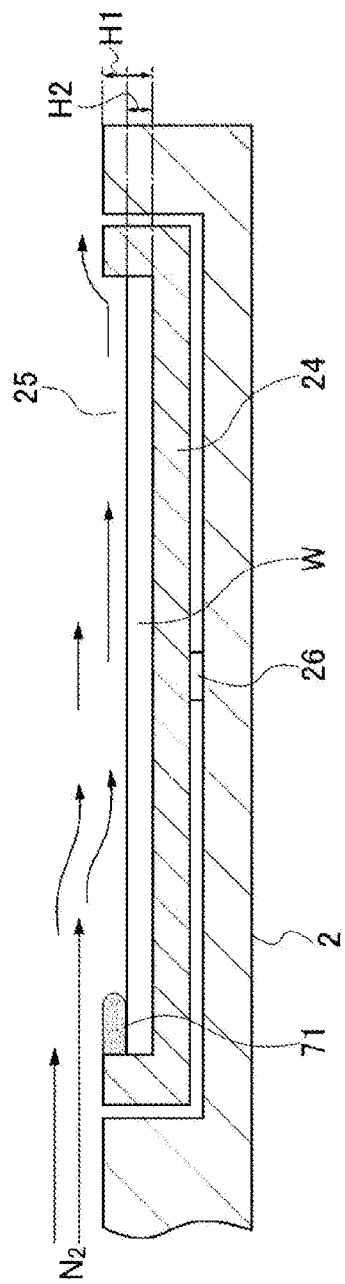
FIG. 12 is a longitudinal cross-sectional view of an example of a wafer holder installed in the rotary table.

On the other hand, as shown in FIG. 12, a height H1 of the side wall of the recess portion 25 of the wafer holder 24, i.e., a depth of the recess portion 25, may be formed to be larger than a thickness H2 of the wafer W in the film forming apparatus 1. In this example, H1 is 1.8 times of H2, for example, H1 is 1.8 millimeters, and H2 is 1 millimeter. The reason for setting H1 to be 1.8 times H2 is as follows. As shown in FIG. 11, the $N_2$ gases discharged from the center area forming portion C and the separation gas nozzles 52 and 55 flow in a horizontal direction across the frontal surface of the rotary table 2 to be exhausted. In FIG. 12, only the $N_2$ gas supplied from the center area forming portion C among the $N_2$ gases is indicated by an arrow. H1 is larger than H2 as described above, and hence there is a step between a top portion of the side wall of the recess portion 25 and the peripheral portion of the top surface of the wafer W. The $N_2$ gas flowing in the horizontal direction over the recess portion 25 from the outside of the adsorption area R1 shows a stationary gas flow at the step of the recess portion 25 on the upstream side in the direction in which the $N_2$ gas flows, so that a portion having a thick film thickness, which will be described later is formed as shown in FIGS. 25 and 26. That is, a gas puddle 71 is formed by the step.

When the recess portion 25 moves to the adsorption area R1 from the outside of the adsorption area R1, the surface atmosphere of the wafer W is changed from the $N_2$ gas to the source gas, so that the concentration of the source gas is increased on the surface of the wafer W and the source gas is adsorbed on the wafer W. However, in the portion in which the gas puddle 71 of the $N_2$ gas is formed, the increase of the concentration of the source gas by the replacement of the $N_2$ gas with the source gas is suppressed compared with the other portions, and hence the adsorption amount of the source gas is relatively small. Since the wafer W rotates about its axis in the above-mentioned manner, the places on the peripheral portion of the wafer W in which the gas puddle 71 of the $N_2$ gas is formed or a relatively large gas puddle 71 of the $N_2$ gas is formed are different whenever the wafer W is located in the adsorption area R1. Thus, over the entire circumference of the wafer W, the film thickness on the peripheral portion can be made smaller than the film thickness on the center portion of the wafer W. For example, when an etching apparatus having an etching rate at the center portion of the wafer W higher than that at the peripheral portion is used in an etching process after the film formation and when it is attempted to improve the uniformity of the film thickness between the peripheral portion and the center portion of the wafer W after the etching process, it is effective to form the recess portion 25 having a property of H1>H2.

Figure 13:
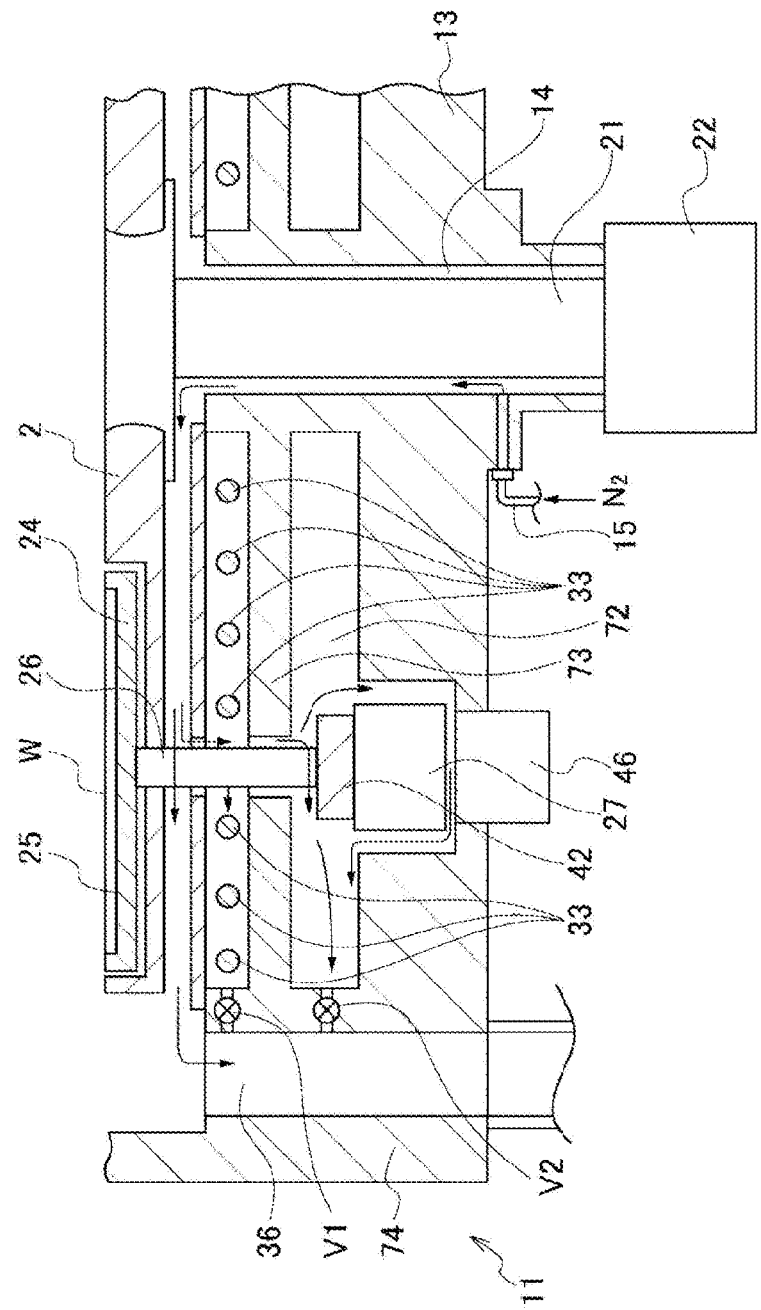
FIG. 13 is a longitudinal cross-sectional view of an example of a vacuum chamber of the film forming apparatus.

FIG. 13 is a longitudinal cross-sectional view of another configuration of the film forming apparatus 1. A difference between the film forming apparatus 1 shown in FIG. 13 and the film forming apparatus 1 shown in FIG. 1 is that, in the film forming apparatus 1 shown in FIG. 13, a space 72 is formed on the lower side of the concave portion 31 of the chamber body 13 in which the heater 33 is provided along the rotational direction of the rotary table 2, and the support ring 42 and the rotation driving part 27 for the wafer rotation are arranged in the space 72. A wall portion 73 is a wall between the concave portion 31 and the space 72. A space in the concave portion 31 and the space 72 are respectively connected to a flow path 74 formed on a downstream side of the evacuation port 36 via valves V1 and V2 in the chamber body 13, and the valves V1 and V2 are opened at a proper opening degree during the film forming process.

In FIG. 13, a flow of the $N_2$ gas supplied from the gas supply pipe 15 is indicated by an arrow. A part of the $N_2$ gas supplied to the center portion of the rear surface of the rotary table 2 from the gas supply pipe 15 flows to the evacuation port 36 along the rear surface of the rotary table 2 to be removed together with each gas flowing from the frontal surface of the rotary table 2. The other part of the $N_2$ gas flows into the concave portion 31 and the space 72 through a gap between the rotation shaft 26 and the shield 34 and a gap between the wall portion 73 and the rotation shaft 26, and reaches the flow path 74. The other part of the $N_2$ gas is then removed together with each gas introduced into the evacuation port 36.

In this manner, the inside of the concave portion 31 and the space 72 are purged by the $N_2$ gas supplied from the gas supply pipe 15. This enables a particle generated from the rotation driving part 27 in the space 72 to be removed from the flow path 74, whereby a scattering of the particle to a surrounding portion is more definitely suppressed. In addition, it is possible to prevent the heater 33 from deteriorating due to an adhesion of the source gas and the oxidizing gas to the heater 33. A supply pipe for supplying an $N_2$ gas to the concave portion 31 and the space 72 may be provided separately from the gas supply pipe 15.

In the above-described example, the source gas nozzle 51 supplies the source gas for the ALD method. However, the source gas nozzle 51 may supply a film forming gas for a film formation by a chemical vapor deposition (CVD) method, so that an orientation of the wafer W is changed by the rotation of the wafer W around its axis whenever the wafer W is located in an area into which the film forming gas is supplied. That is, the apparatus can be configured without the oxidizing gas nozzle and the separation gas nozzle.

Figure 14:
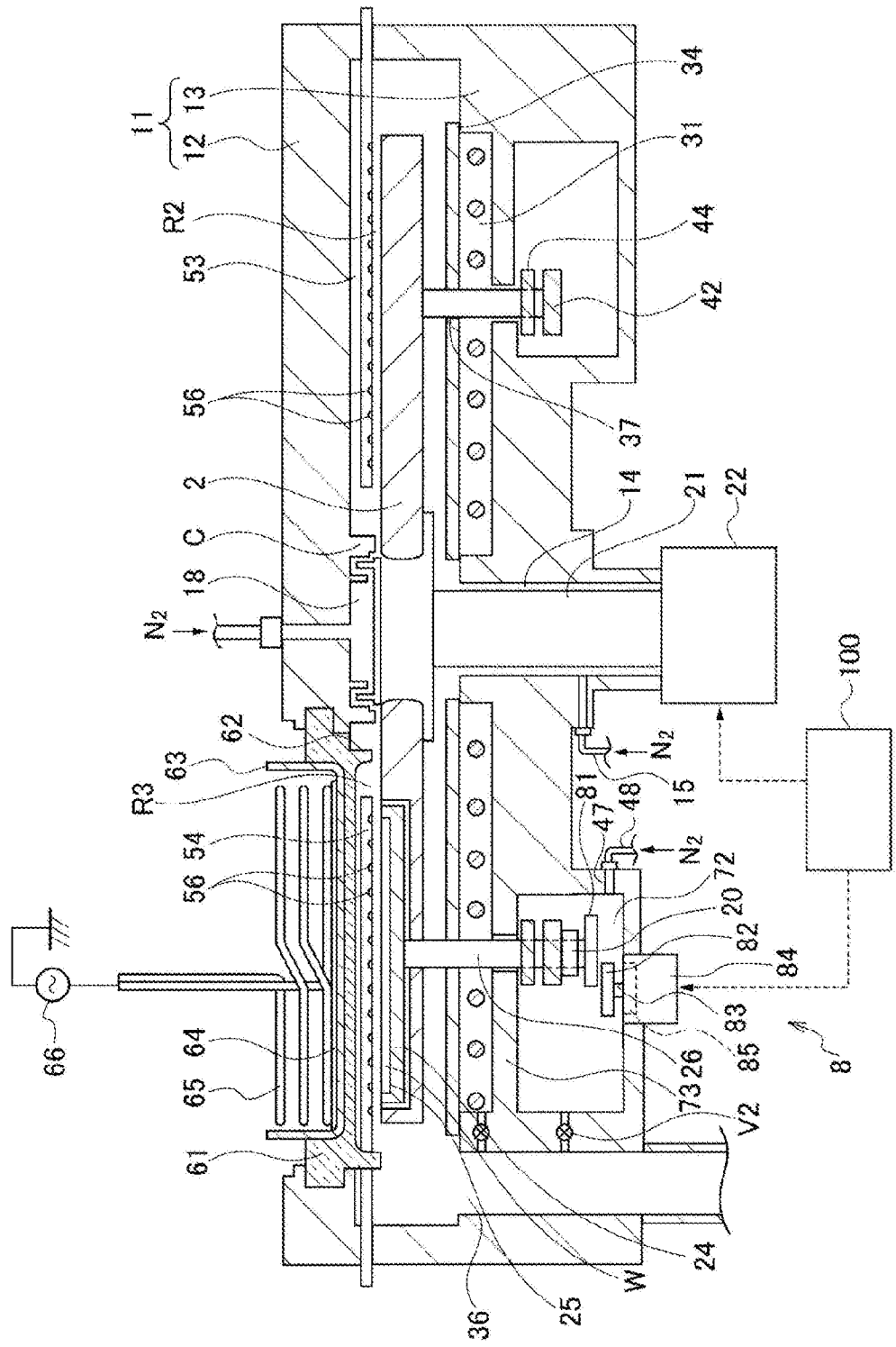
FIG. 14 is a longitudinal cross-sectional view of a film forming apparatus according to another embodiment of the present disclosure.
Figure 15:
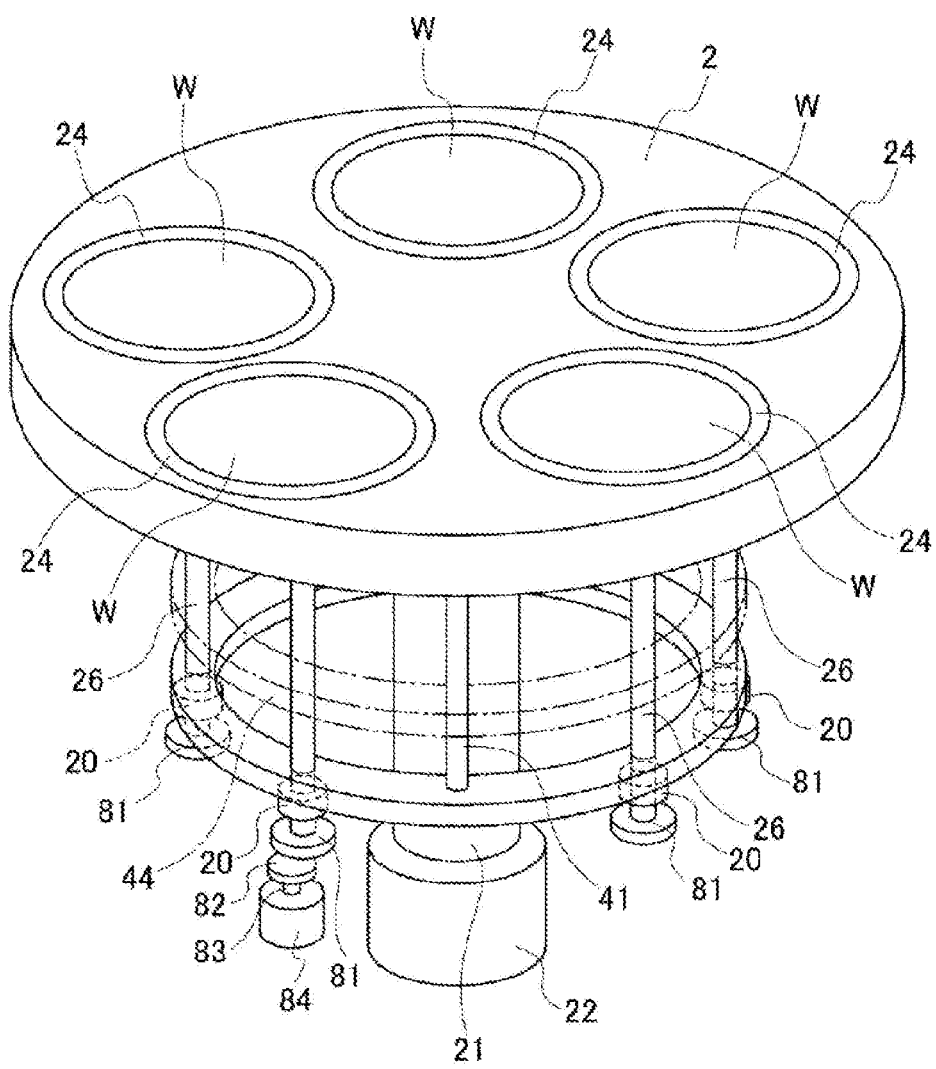
FIG. 15 is a perspective view of an upper-side of a rotary table of the film forming apparatus shown in FIG. 14.

FIG. 14 is a longitudinal cross-sectional view of a film forming apparatus 8 as another example of a film forming apparatus, and FIG. 15 is a perspective view of a rotary table 2 of the film forming apparatus 8. The film forming apparatus 8 is described below focusing on a difference between the film forming apparatus 8 and the film forming apparatus 1. The rotation shaft 26 of a wafer holder 24 on the rotary table 2 of the film forming apparatus 8 is arranged to penetrate a support ring 42 and a magnetic sealing part 20 in a vertical direction. A magnetic gear 81, which is a first rotating member having a horizontal disk plate shape, is coupled to a bottom portion of the rotation shaft 26 in a space 72 described with reference to FIG. 13. The magnetic gear 81 includes a plurality of magnets arranged along a circumferential direction which is a rotational direction thereof, and the magnets are arranged such that N poles and S poles are located in an alternate manner along the circumferential direction. The rotation shaft 26 rotates around its axis by a rotation of the magnetic gear 81.

Further, a magnetic gear 82, which is a second rotating member having a horizontal disk plate shape, is provided on a lower side of the magnetic gear 81 in the space 72. Like the magnetic gear 81, the magnetic gear 82 includes a plurality of magnets. However, the size and the number of poles of the magnetic gear 82 differ from those of the magnetic gear 81. A center of the magnetic gear 82 is deviated from a center of the magnetic gear 81 toward a peripheral end of the rotary table 2, in order to rotate the magnetic gear 81 by the magnetic gear 82, as described later. The magnetic gear 82 is coupled to a rotation driving part 84 provided on a bottom portion of the film forming apparatus 8 via a rotation shaft 83. The rotation driving part 84 rotates the magnetic gear 82 via the rotation shaft 83.

The rotation driving part 84 includes a magnetic sealing part 85 and a motor (not shown). The magnetic sealing part 85 includes a bearing for the rotation shaft 83 and a magnetic seal for sealing a gap around the rotation shaft 83, and is configured to suppress a scattering of a particle generated from the bearing to the space 72 of a vacuum atmosphere. Specifically, for example, the magnetic sealing part 85 prevents a scattering of a lubricant used in the bearing to the space 72. Further, the magnetic sealing part 85 also serves to partition the vacuum atmosphere of the space 72 from the atmospheric environment outside the vacuum chamber 11. In the film forming apparatus 8, as described with reference to FIG. 13, the $N_2$ gas is flown into the concave portion 31 and the space 72 from a gas supply pipe 15, thereby purging the concave portion 31 and the space 72. Further, like the film forming apparatus 1, a gas supply path 47 for supplying the $N_2$ gas from a gas nozzle 48 is opened into the space 72, thereby purging the space 72 by the $N_2$ gas.

The magnetic gear 81 revolves by a revolution of the wafer holder 24, and passes above the rotating magnetic gear 82 such that a peripheral portion of the magnetic gear 81 and a peripheral portion of the magnetic gear 82 are overlapped with each other. While the peripheral portion of the magnetic gear 81 and the peripheral portion of the magnetic gear 82 are overlapped with each other, the magnetic gear 81 rotates in a non-contact manner with respect to the magnetic gear 82 at a number of rotations corresponding to that of the magnetic gear 82 by a magnetic force exerted between the magnetic gear 81 and the magnetic gear 82. The rotation of the magnetic gear 81 causes the wafer holder 24 to rotate, and consequently, the wafer W rotates. That is, in the film forming apparatus 8, the rotation of the wafer W is only performed in a limited time for which the magnetic gear 81 and the magnetic gear 82 are overlapped with each other, and hence the rotation of the wafer W is performed intermittently during the revolution thereof. In this example, the size and the number of poles are set such that a rotation speed of the magnetic gear 81 becomes slower than that of the magnetic gear 82.

As in the film forming apparatus 1, the operator selects a recipe (the target film thickness T and the rotation speed V of the rotary table 2), the cycle rate R, and the number of rotations N from a setting part 101 in the film forming apparatus 8, so that the rotation speed A (rpm) of the wafer W is calculated. The number of rotations of the motor that constitutes the rotation driving part 84 rotating the magnetic gear 82 is then controlled such that the wafer W is allowed to rotate at the calculated rotation speed.

Figure 16:
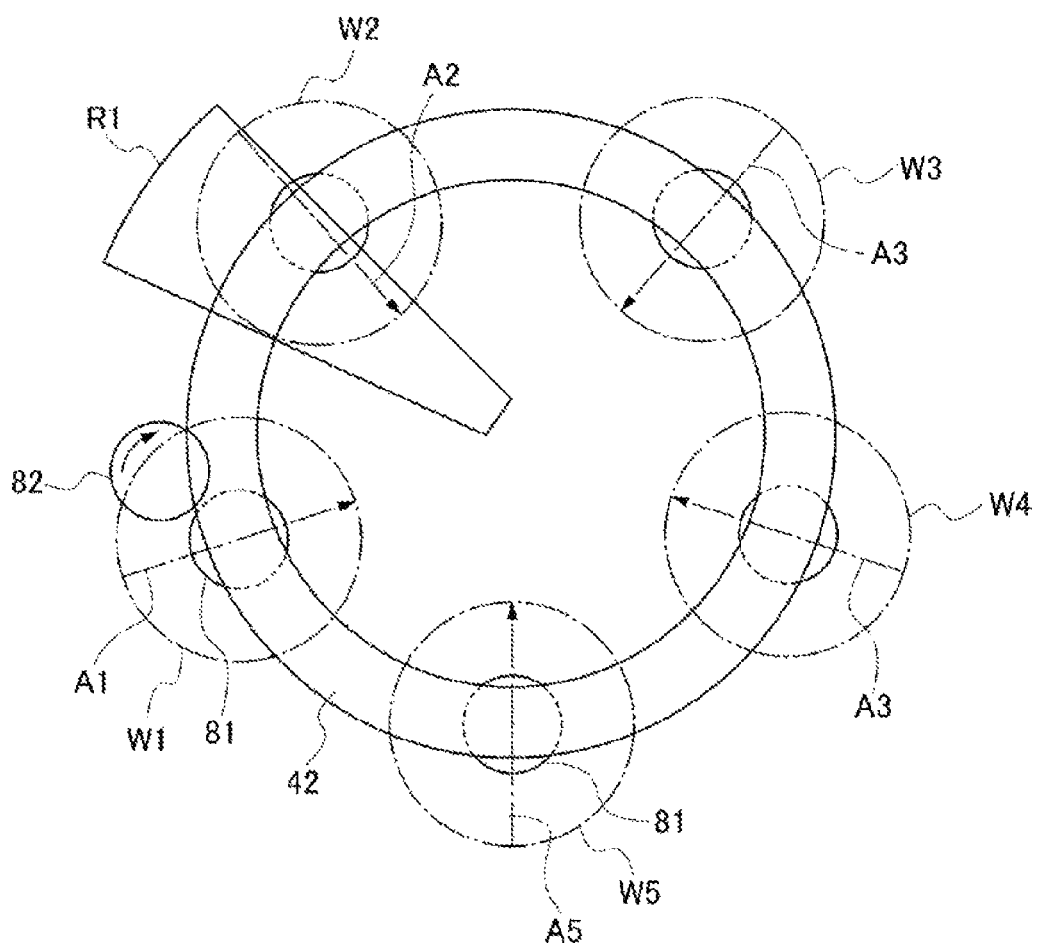
FIGS. 16 to 18 are schematic diagrams for illustrating a rotation of a wafer loaded on the rotary table.
Figure 17:
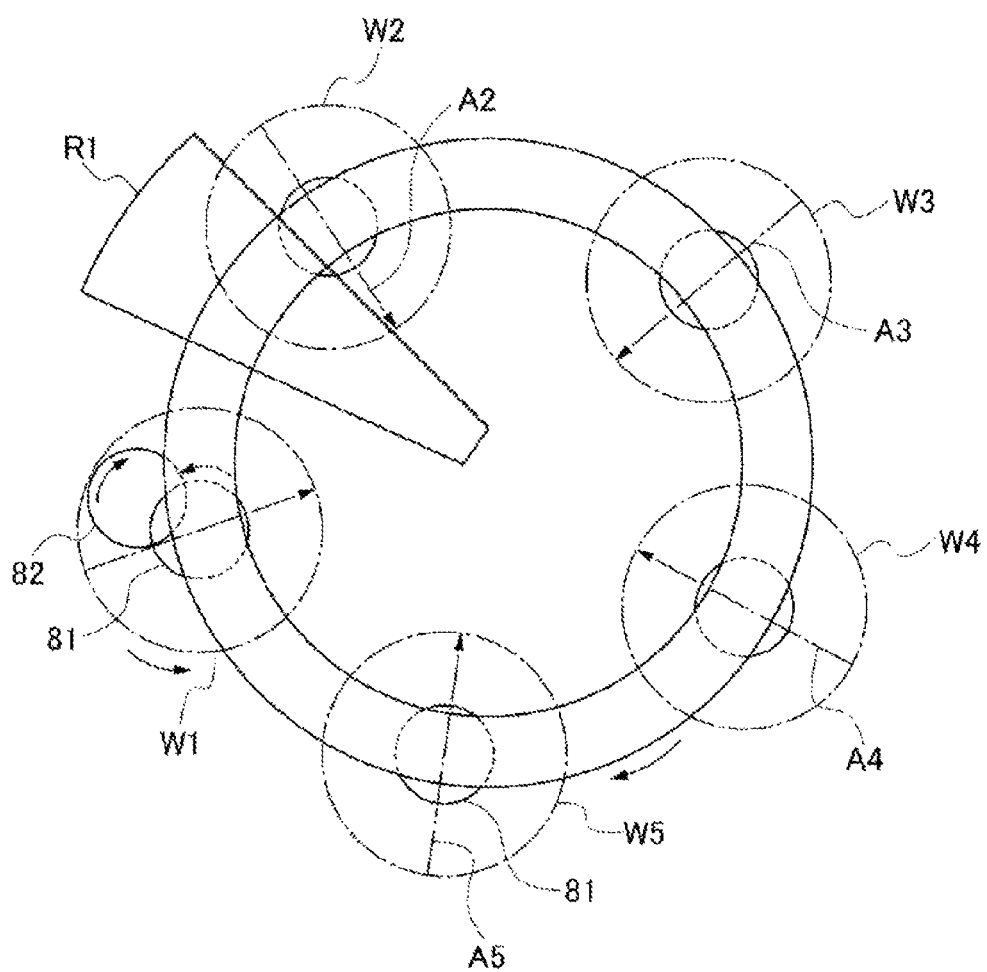
Figure 18:
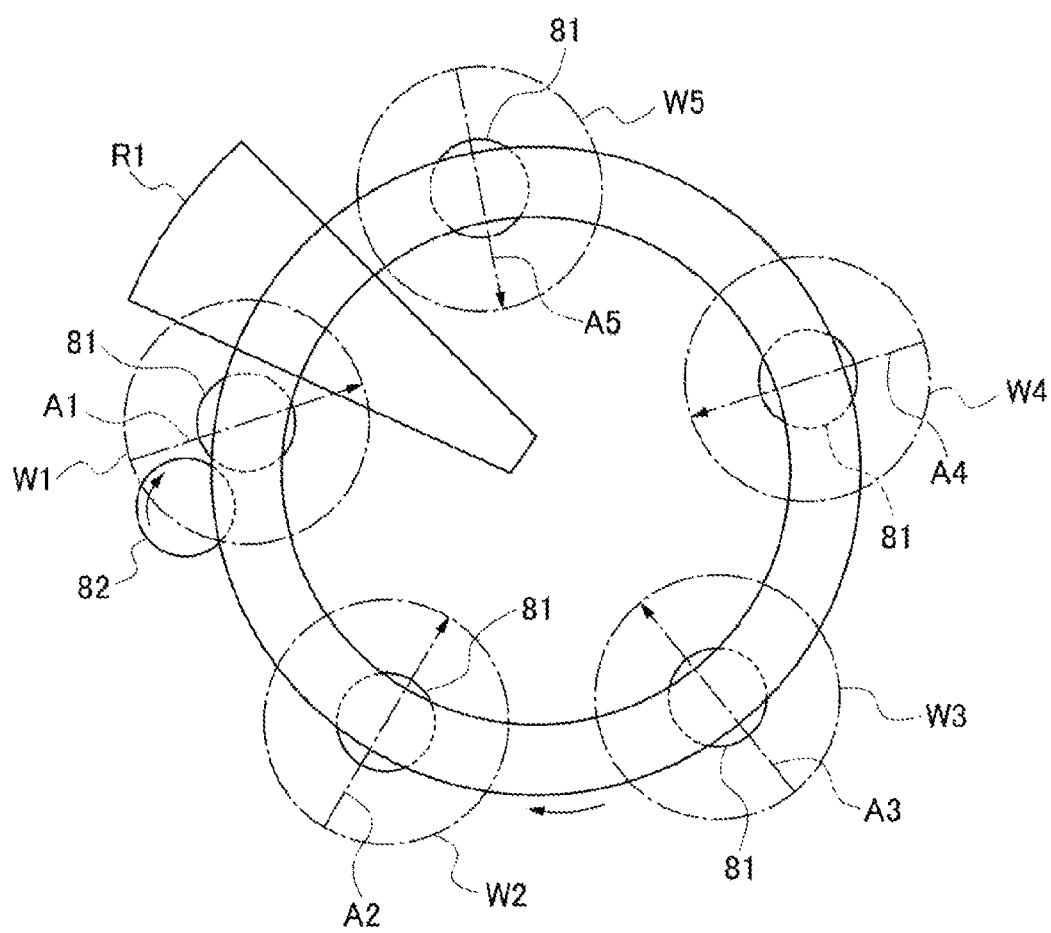

FIGS. 16 to 18 are schematic diagrams illustrating the rotation and revolution of the wafer W during a film forming process. In FIGS. 16 to 18, as in FIGS. 7 to 10, the wafers W are represented by W1 to W5, respectively, and orientations of the wafers W1 to W5 are represented by arrows A1 to A5, respectively. At the time of a film forming process, each gas is supplied in the same manner as in the film forming apparatus 1. The rotary table 2 rotates at the rotation speed set by the operator, and the wafer W revolves by the rotation of the rotary table 2. While the wafer revolves, the motor of the rotation driving part 84 rotates at the rotation speed calculated in the above manner based on the rotation speed of the rotary table 2, thereby rotating the magnetic gear 82 (see FIG. 16).

For example, when the magnetic gear 81 coupled to the wafer holder 24 holding the wafer W1 is moved to above the magnetic gear 82 from an upstream side of the rotational direction by the rotation of the rotary table 2 to be overlapped with the magnetic gear 82, the rotation of the magnetic gear 81 is started by the magnetic force between the magnetic gear 81 and the magnetic gear 82, thereby rotating the wafer W1 (see FIG. 17). When the rotation of the rotary table 2 continues and the magnetic gear 81 is moved to a downstream side of the rotational direction with respect to the magnetic gear 82, the magnetic force is weakened and the rotation of the wafer W1 is stopped. As described above, since the rotation speed of the wafer W is calculated based on the rotation speed of the rotary table 2, the orientation of the wafer W1 when it stops its rotation differs from the orientation when it starts the rotation, and in the state in which the orientation is changed, the wafer W1 moves to the adsorption area R1 by the revolution. A change amount of the orientation depends on the rotation speed of the wafer W calculated in the above manner.

While the revolution continues, whenever the magnetic gear 81 moves to a position above the magnetic gear 82, the wafer W1 rotates and has a changed orientation in the above-described manner, so that the wafer W1 enters into the adsorption area R1 with the changed orientation. In the same manner as the wafer W1, the wafers W2 to W5 enter into the adsorption area R1 with orientations changed by the rotation in every revolution. Therefore, in the same manner as the film forming apparatus 1, the film forming apparatus 8 can improve the uniformity of the film thickness along the circumferential direction of the wafer W. In addition, as the film forming apparatus 8 does not necessitate a plurality of rotation driving parts 84 to rotate the wafers W1 to W5, respectively, a cost for manufacturing the apparatus can be decreased. Further, as the magnetic gears 81 and 82 are coupled with each other in a non-contact manner to transfer the power of the rotation driving part 84 to the wafer holder 24, the generation of the particle is suppressed. Even when a particle is generated between the rotation shaft 26 for rotating the wafer W and the support ring 42 for supporting the rotation shaft 26, the particle is prevented from being attached on the wafer W since the rotation shaft 26 and the support ring 42 are arranged in the space 72 that is purged by the $N_2$ gas at the time of the film forming process.

Figure 19:
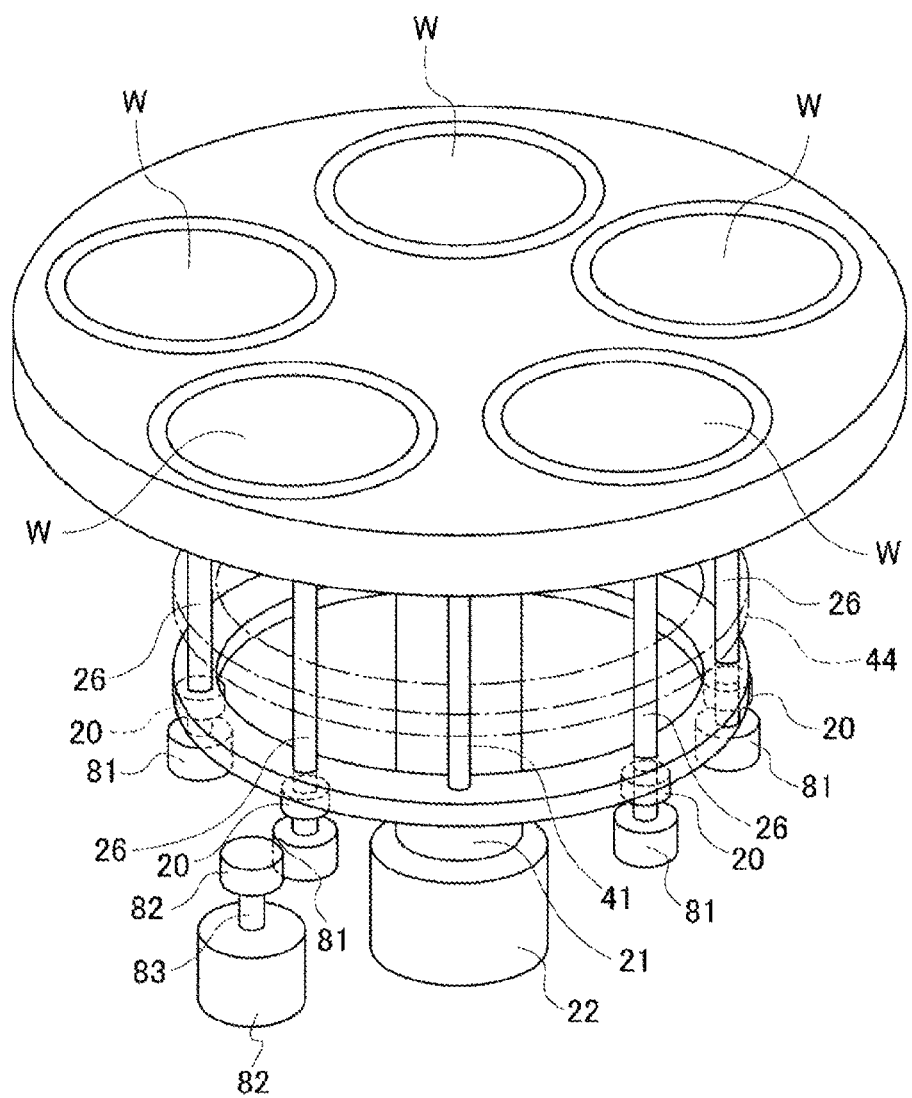
FIG. 19 is a perspective view of an upper-side of a rotary table of another film forming apparatus.

Although the film forming apparatus 8 includes only one set of the magnetic gear 82 and the rotation driving part 84, a plurality of sets of the magnetic gear 82 and the rotation driving part 84 may be provided so that the wafers W at a plurality of locations rotate while the wafer W makes one revolution. Further, the magnetic gears 81 and 82 may be arranged in parallel with each other in a horizontal direction as shown in FIG. 19, so that the magnetic gear 81 located near the magnetic gear 82 by the revolution is selectively rotated, thereby rotating the wafer W intermittently. Although the magnetic gears 81 and 82 are shown in a circular columnar shape in the example shown in FIG. 19, these magnetic gears include a plurality of magnets, like the magnetic gears 81 and 82 having the a disk plate shape shown in FIGS. 14 and 15. Although both the magnetic gears 81 and 82 include the magnets in the above example, one of them may be implemented by a magnetic body instead of the magnet. For example, the magnetic gear 82 may be formed of a magnet, and the magnetic gear 81 may be formed of a magnetic body such as iron. Accordingly, as described in a previous example, when the magnetic gear 81 approaches the magnetic gear 82, the magnetic gear 81 is rotated in response to the rotation of the magnetic gear 82, thereby rotating the wafer W. In some embodiments, the magnetic gear 81 may include a magnetic body while the magnetic gear 82 including a magnet.

(Evaluation Test)

An evaluation test of the film forming apparatus according to the present disclosure is described below. In the description of each evaluation test, for the wafer W loaded on the wafer holder 24, the line passing through the center of the wafer W, which matches the line passing through the center of the rotary table 2 at the time of starting the film forming process, is referred to as a Y line. Therefore, the Y line corresponds to a line represented by each of the arrows A1 to A5 shown in FIG. 7. The line of the wafer W perpendicular to the Y line is referred to as an X line.

Evaluation Test 1

A test was performed to investigate a change of distribution of the film thickness due to the rotation of a wafer W having a diameter of 300 mm. As an evaluation test 1-1, a simulation was performed, in which a film was formed on the wafer W without rotating the wafer W in the film forming apparatus 1. Further, as an evaluation test 1-2, a simulation was performed, in which a film was formed on the wafer W under the same condition as that in the evaluation test 1-1 except that the rotation of the wafer W was performed. In the evaluation test 1-2, unlike the embodiments, the wafer was set to rotate only by 180 degrees from the start of the film forming process until the end of the film forming process. Moreover, as an evaluation test 1-3, the same evaluation test as the evaluation test 1-2 was performed except that the wafer W was set to rotate only 45 degrees. In addition, as an evaluation test 1-4, a simulation was performed under the same condition as those of the evaluation tests 1-1 to 1-3, except that the wafer W was set to rotate on its axis for a integer number as in the embodiments. In each of the evaluation tests 1-1 to 1-4, the distribution of the in-plane film thickness on the wafer W was measured.

Figure 20A:
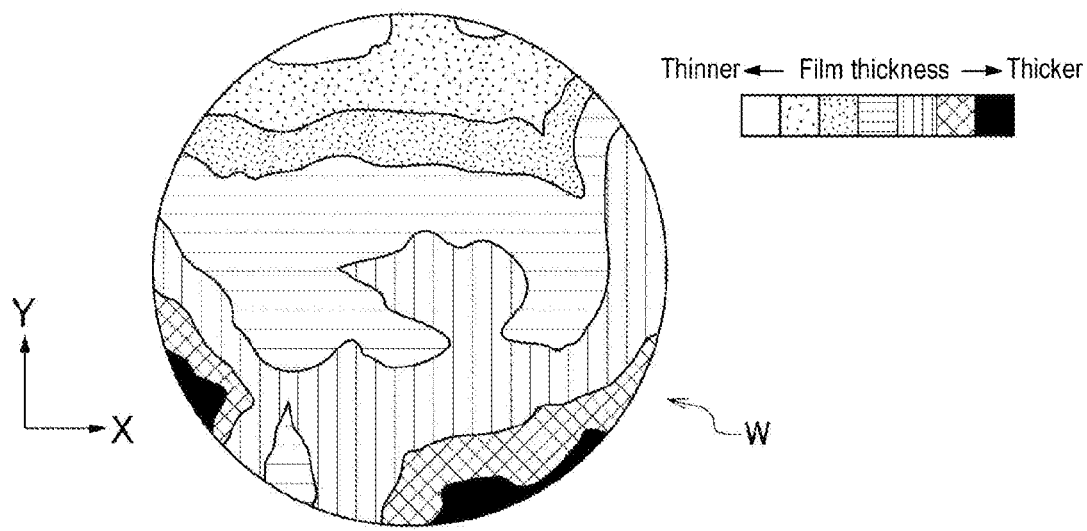
FIGS. 20A and 20B and 21A and 21B are schematic diagrams for illustrating a distribution of film thickness on a wafer obtained from evaluation tests.
Figure 20B:
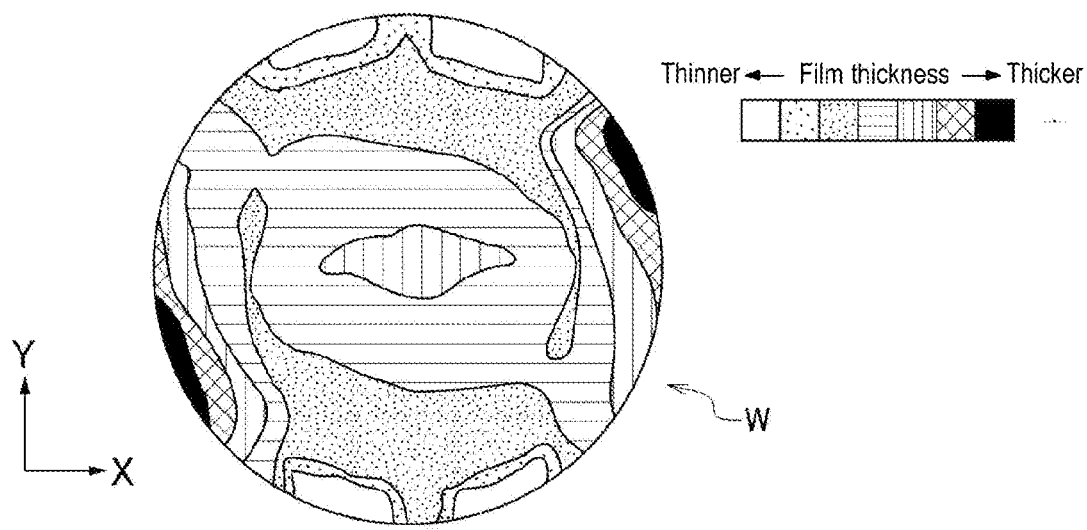
Figure 21A:
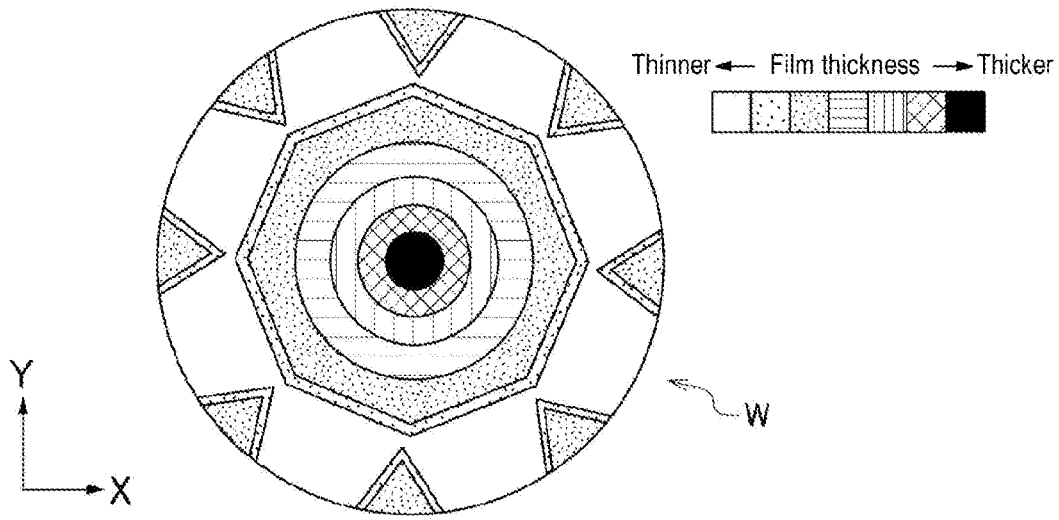
Figure 21B:
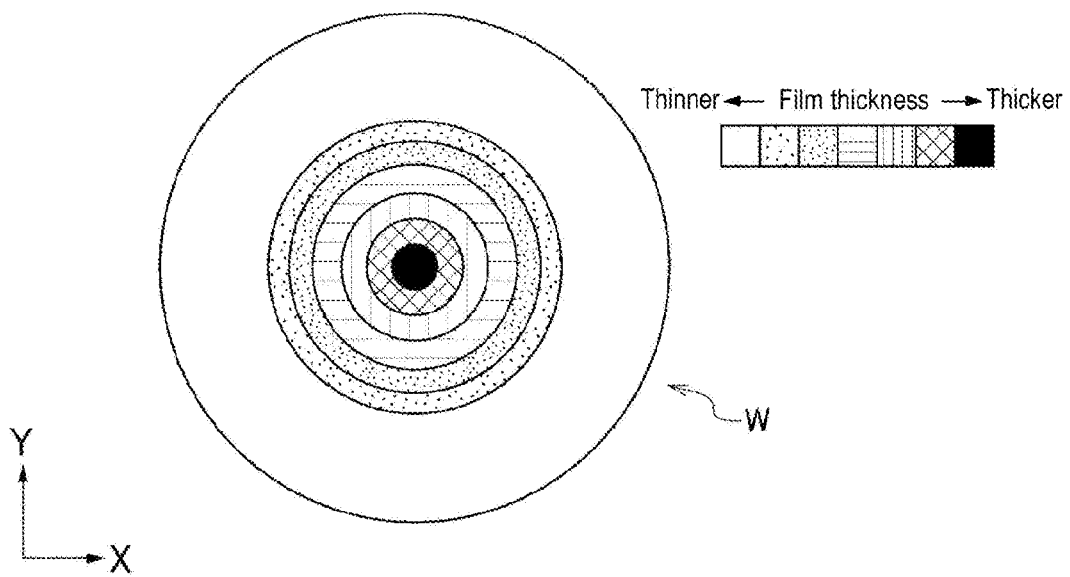

FIGS. 20A and 20B illustrate the distributions of the in-plane film thickness on the wafer W in the evaluation tests 1-1 and 1-2, respectively, and FIGS. 21A and 21B illustrate the distributions of the in-plane film thickness on the wafer W in the evaluation tests 1-3 and 1-4, respectively. An actual test result is a computer graphic in which colors are allocated depending on the in-plane film thickness on the wafer W. However, FIGS. 20A through 21B show shapes formed by encircling areas in the wafer plane having the same predetermined thickness range as a contour line, for the sake of convenience.

Figure 22A:
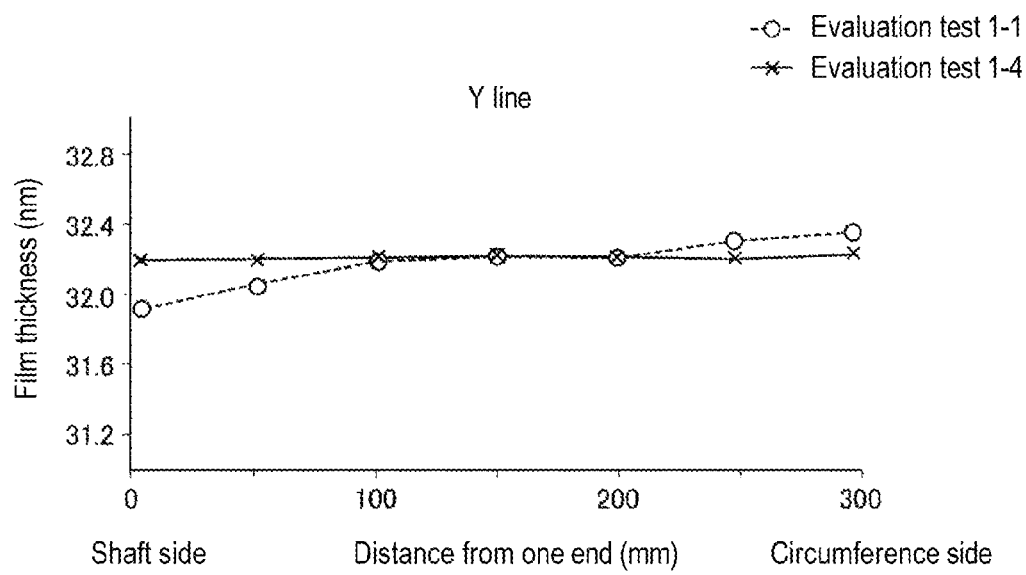
FIGS. 22A and 22B and 23A and 23B are graphs showing a distribution of film thickness on a wafer obtained from evaluation tests.
Figure 22B:
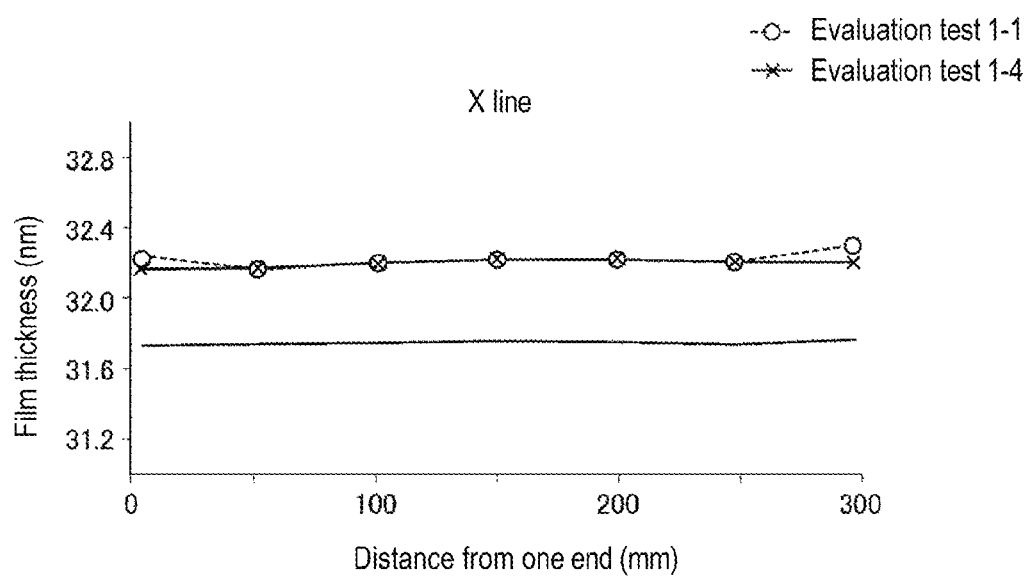
Figure 23A:
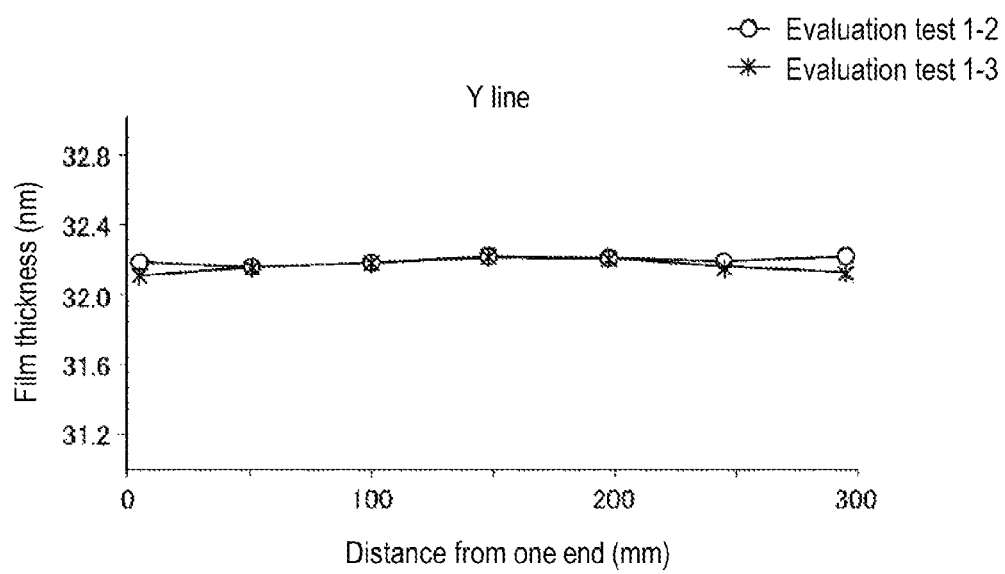
Figure 23B:
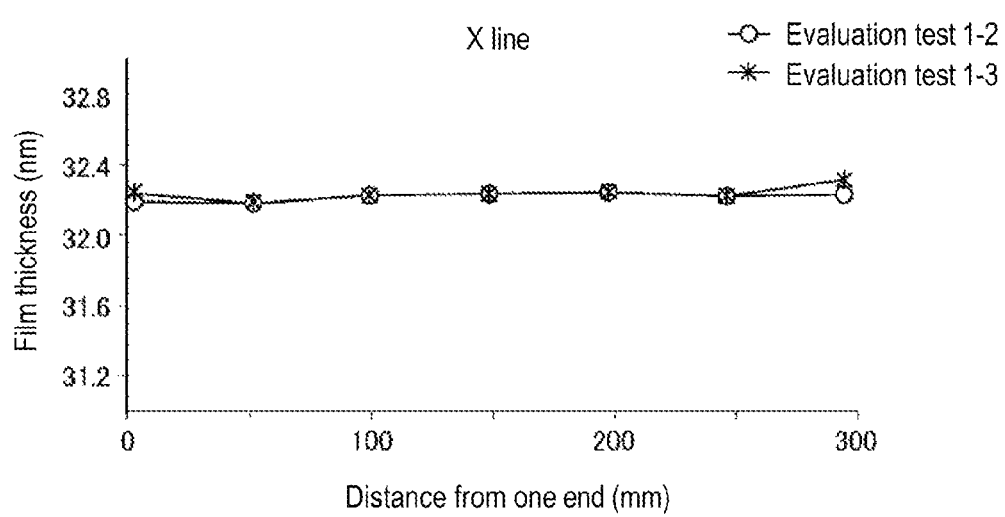

FIG. 22A is a graph showing the distribution of the film thickness on the Y line in the evaluation tests 1-1 and 1-4, and FIG. 22B is a graph showing the distribution of the film thickness on the X line in the evaluation tests 1-1 and 1-4. The horizontal axis of each of the graphs represents a distance (unit: millimeter) from an end of the wafer W. The end of the wafer W in the graph of the Y line refers to an end on the center shaft side of the rotary table 2. The vertical axis of each graph represents a film thickness (unit: nanometer). FIG. 23A is a graph showing the distribution of the film thickness on the Y line in the evaluation tests 1-2 and 1-3, and FIG. 23B is a graph showing the distribution of the film thickness on the X line in the evaluation tests 1-2 and 1-3.

From the schematic diagrams of the wafer W in FIGS. 20A through 21B, it is found that the uniformity of the film thickness along the circumferential direction of the wafer W was improved by rotating the wafer W, and that the uniformity of the film thickness along the circumferential direction was considerably improved in the evaluation tests 1-4 in which the wafer W was rotated for the integer number. Further, from each of the graphs, it is found that the distribution of the film thickness on the X line did not show a big difference between the evaluation tests 1-1 to 1-4. Regarding the distribution of the film thickness on the Y line, a slight difference in the film thickness between one end portion and the other end portion of the Y line appearing in the evaluation test 1-1 is decreased in the evaluation tests 1-2 and 1-3 and substantially disappeared in the evaluation test 1-4. That is, it is also found from each of the graphs that the uniformity of the distribution of the film thickness in the circumferential direction of the wafer W has been improved.

For the evaluation tests 1-1 to 1-4, Table 1 shows an average value of the film thickness, the maximum film thickness, the minimum film thickness, a difference between the maximum film thickness and the minimum film thickness, and WinW that is an index indicating the in-plane uniformity, all of which are calculated from film thicknesses measured at 49 points on the wafer plane including each measurement point on the X line and Y line. The WinW is represented by ±{(maximum film thickness−minimum film thickness)/(average value of film thickness)}/2×100(%), and Table 1 shows an absolute value of the WinW. The smaller this absolute value is, the higher the in-plane uniformity is. Comparing the WinW values of the evaluation tests 1-1 to 1-4, it is found that the uniformity of the film thickness has been improved not only in the circumferential direction of the wafer W but also on the entire plane of the wafer W by rotating the wafer W, and that the evaluation test 1-4 shows the highest uniformity of the film thickness on the entire plane of the wafer W among the four evaluation tests. Accordingly, from the evaluation test 1, it is found that the rotation of the wafer W is effective in improving the uniformity of the film thickness as described in the above-mentioned embodiments and that setting an integer as the number of rotations is particularly effective in achieving the uniformity of the film thickness.

TABLE 1

| | Average value (nm) | Maximum value (nm) | Minimum value (nm) | Maximum value − Minimum value (nm) | WinW |
|---|---|---|---|---|---|
| Evaluation test 1-1 | 32.19 | 32.42 | 31.77 | 0.65 | 1.01 |
| Evaluation test 1-2 | 32.19 | 32.34 | 32.06 | 0.28 | 0.44 |
| Evaluation test 1-3 | 32.19 | 32.23 | 32.18 | 0.05 | 0.08 |
| Evaluation test 1-4 | 32.19 | 32.23 | 32.19 | 0.05 | 0.07 |

Evaluation Test 2

As an evaluation test 2, a test was performed to investigate an influence of the height H1 of the side wall of the recess portion 25 of the wafer holder 24 described with reference to FIG. 12 and the rotation of the wafer W on the distribution of the film thickness. In an evaluation test 2-1, a simulation in which a film forming process was performed without rotating the wafer W in the film forming apparatus 1, as in the evaluation test 1-1, was performed under the condition where the height H1 of the side wall is set to be 1.0 millimeter that is the thickness H2 of the wafer W. The number of rotations of the rotary table 2 was set to be 120 rpm. Further, as an evaluation test 2-2, a simulation was performed under the same conditions as those in the evaluation test 2-1 except that the wafer W rotated and revolved, and the thickness of the film was measured at each portion of the wafer W. Moreover, as evaluation tests 2-3 and 2-4, a simulation was performed under the same condition as those in the evaluation tests 2-1 and 2-2, respectively, except that the height H1 of the side wall was set to be 1.8 millimeters as shown in FIG. 12. The film thickness on each portion of the wafer W was measured for the evaluation tests 2-1 to 2-4.

Figure 24A:
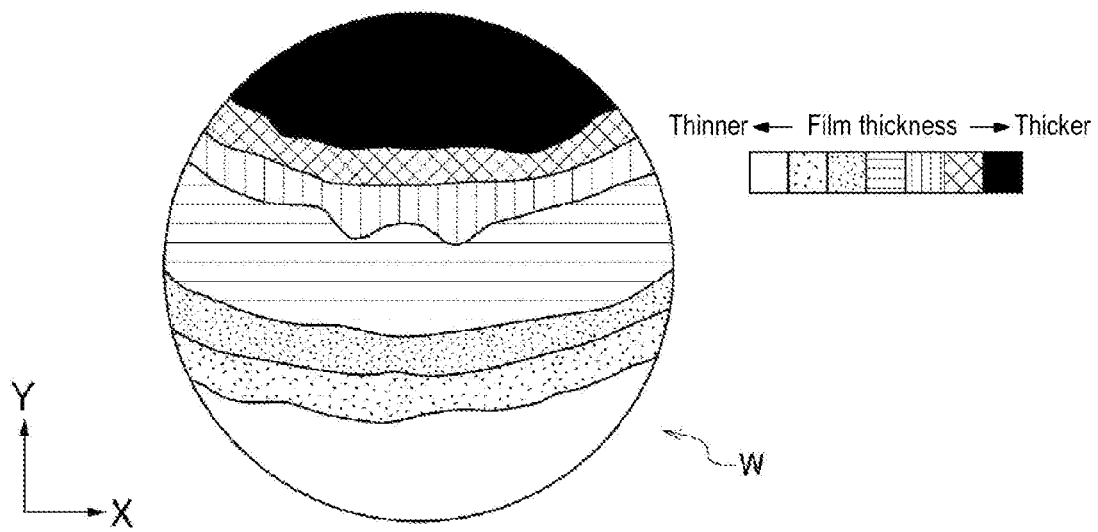
FIGS. 24A and 24B and 25A and 25B are schematic diagrams for illustrating a distribution of film thickness on a wafer obtained from evaluation tests.
Figure 24B:
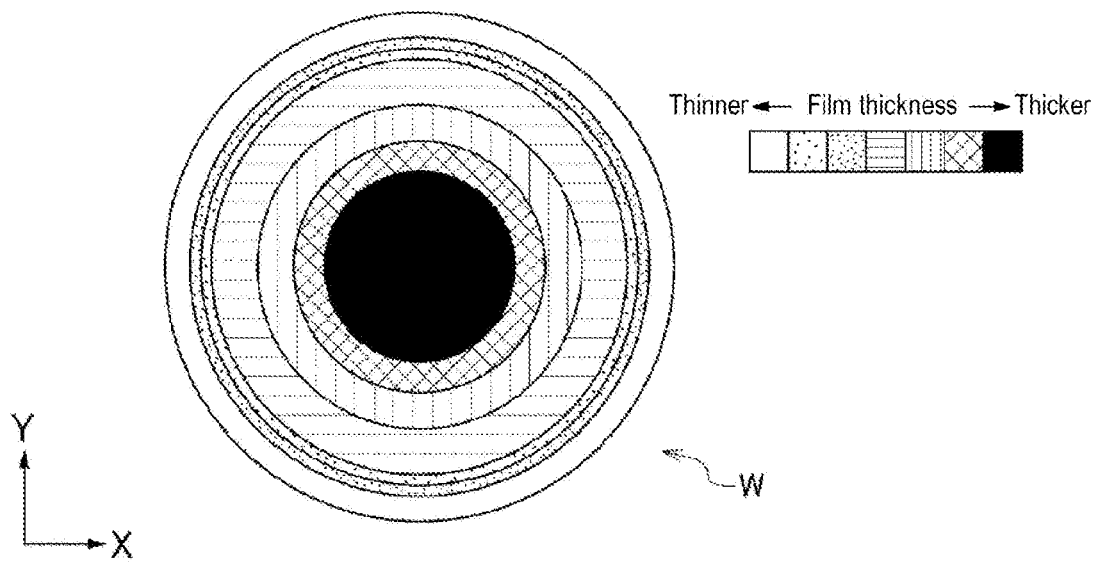
Figure 25A:
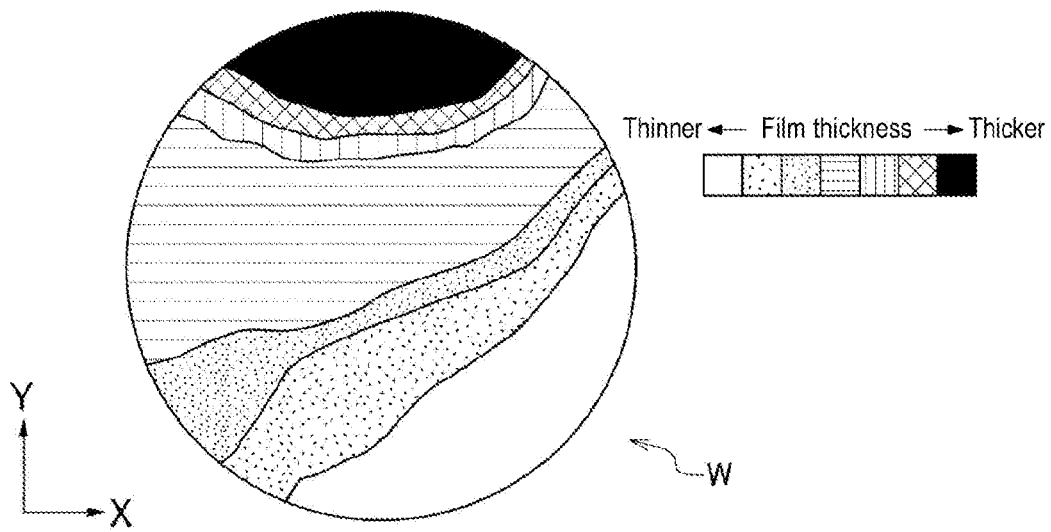
Figure 25B:
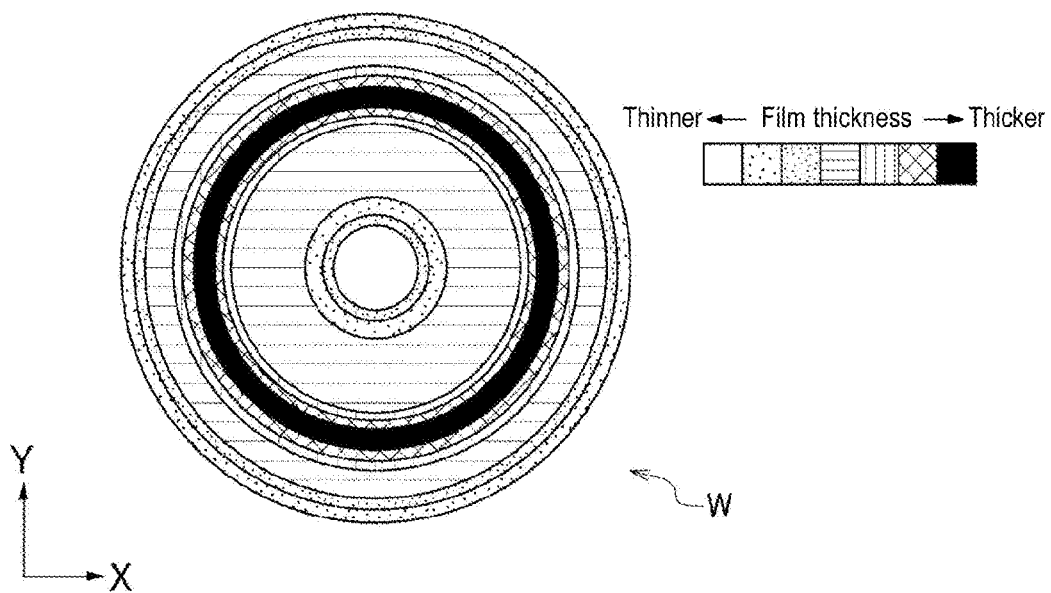
Figure 26A:
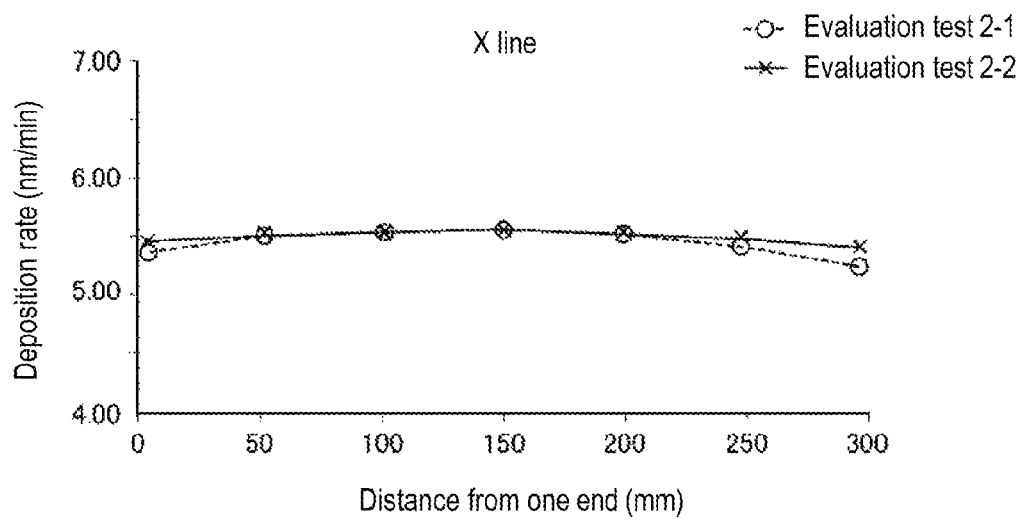
FIGS. 26A and 26B and 27A and 27B are graphs showing a distribution of film thickness on a wafer obtained from evaluation tests.
Figure 26B:
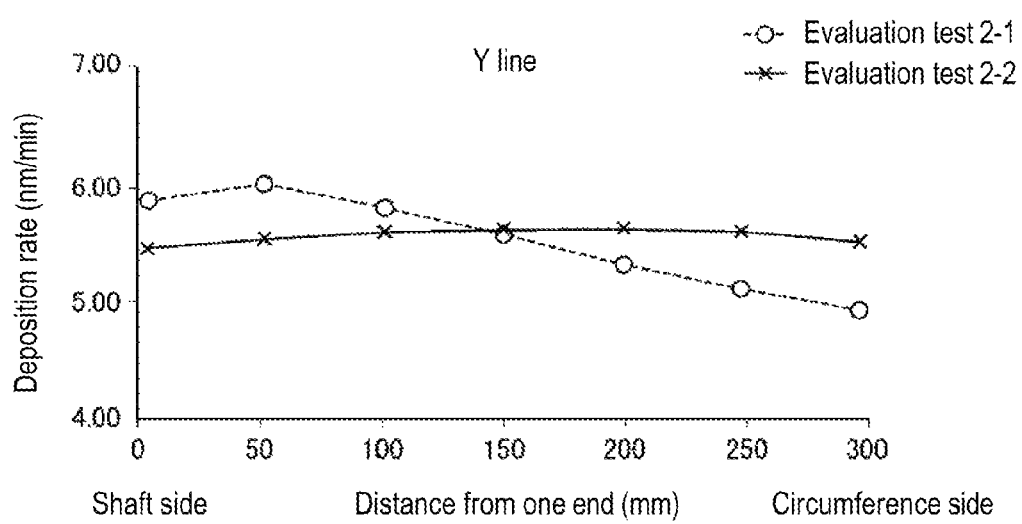
Figure 27A:
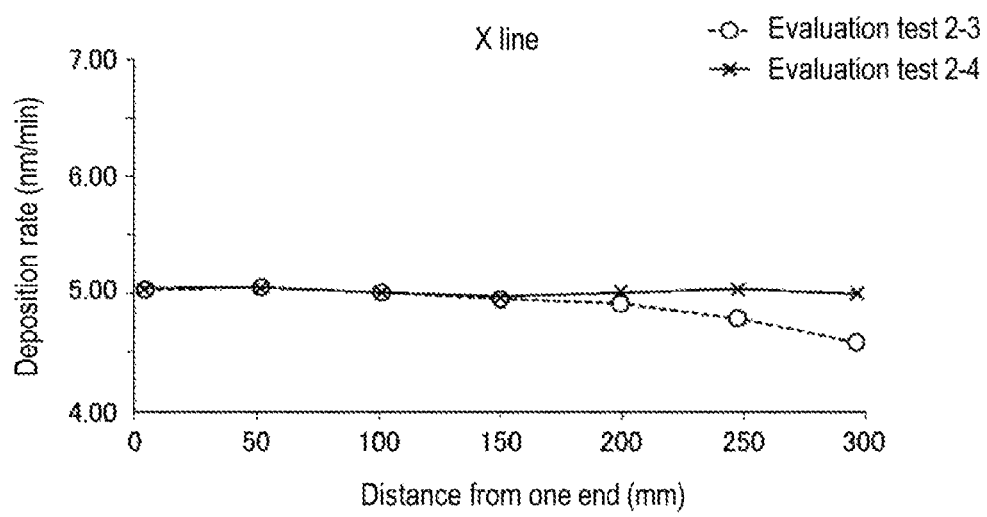
Figure 27B:
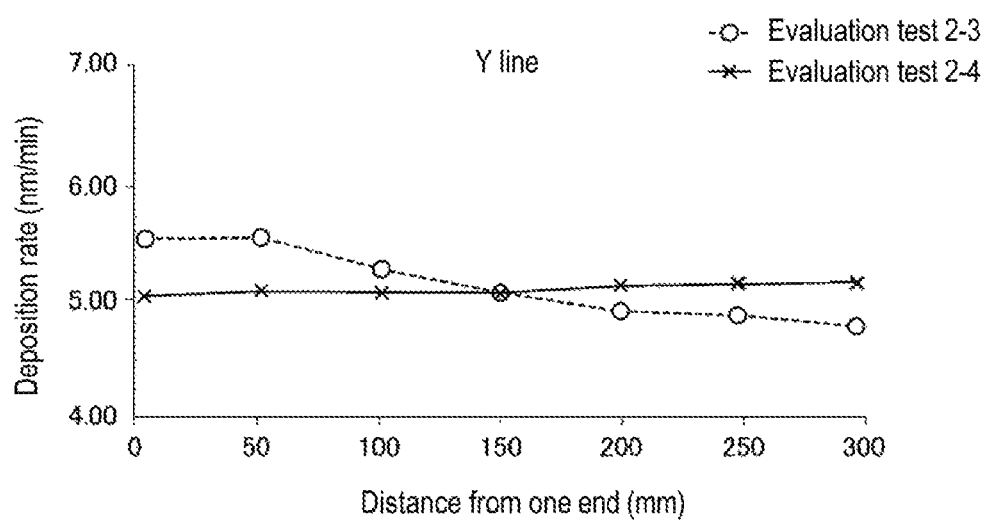

FIGS. 24A and 24B schematically show images of the distribution of the film thickness on the wafer W obtained in the evaluation tests 2-1 and 2-2, respectively, in the same manner as in the evaluation test 1. FIGS. 25A and 25B schematically show wafers related to the evaluation tests 2-3 and 2-4, respectively, in the same manner as FIGS. 24A and 24B. FIG. 26A shows a graph of the distribution of the film thickness on the X line in the evaluation tests 2-1 and 2-2, and FIG. 26B shows a graph of the distribution of the film thickness on the Y line in the evaluation tests 2-1 and 2-2. FIG. 27A shows the distribution of the film thickness of the X line in the evaluation tests 2-3 and 2-4, and FIG. 27B shows a graph of the distribution of the film thickness of the Y line in the evaluation tests 2-3 and 2-4. The horizontal axis of each of the graphs shown in FIGS. 26A to 27B represents a distance from an end of the wafer W, like the horizontal axis of each of the graphs in the evaluation test 1. However, the vertical axis represents a deposition rate (unit: nm/min) instead of the film thickness.

From the schematic diagrams and the graphs of FIGS. 24A to 27B, it is found that the uniformity of the film thickness in the circumferential direction of the wafer W can be improved by rotating the wafer W regardless of the height H1 of the side wall. Regarding the film thickness at both end portions of the X line and the Y line, it was found that the film thickness was about 5.5 millimeters in the evaluation test 2-2 in which the height H1 of the side wall is set to be 1 millimeter, and the evaluation test 2-4 in which the height H1 of the side wall is set to be 1.8 millimeters shows about 5.0 millimeters, i.e., the evaluation test 2-4 obtains a thinner film thickness. Therefore, in order to reduce the film thickness on the peripheral portion of the wafer W, it is effective to set the height H1 of the side wall to be larger than the thickness of the wafer W and to form a step between the recess portion 25 and the wafer W as described in the above-mentioned embodiments.

In the same manner as the evaluation test 1, for the evaluation tests 2-1 to 2-4, Table 2 shows an average value of the film thickness, the maximum value of the film thickness, the minimum value of the film thickness, a difference between the maximum value and the minimum value, and WinW that is an index indicating the in-plane uniformity, all which are calculated from film thicknesses measured at measurement points on the wafer W. From a comparison of the test results of the evaluation tests 2-1 and 2-2 and a comparison of the test results of the evaluation tests 2-3 and 2-4, it is found that the WinW can be decreased by rotating the wafer W. Accordingly, it is found that the uniformity of the film thickness can be improved not only in the circumferential direction of the wafer W but also on the entire plane of the wafer W by rotating the wafer W.

TABLE 2

| | Average value (nm) | Maximum value (nm) | Minimum value (nm) | Maximum value − Minimum value (nm) | WinW |
|---|---|---|---|---|---|
| Evaluation test 2-1 | 5.50 | 6.03 | 4.91 | 1.12 | 10.24 |
| Evaluation test 2-2 | 5.50 | 5.58 | 5.44 | 0.14 | 1.31 |
| Evaluation test 2-3 | 5.07 | 5.61 | 4.66 | 0.96 | 9.36 |
| Evaluation test 2-4 | 5.07 | 5.10 | 5.04 | 0.06 | 0.63 |

Evaluation Test 3

As an evaluation test 3, an influence of the recess portion 25 of the wafer holder 24 on the distribution of the film thickness was investigated. In the evaluation test 3, a simulation in which a film was deposited on the wafer W without rotating the wafer W was performed, and the film thickness was measured on each portion of the wafer W. The height H1 of the side wall of the recess portion 25 was set to be 1.0 millimeter in evaluation tests 3-1 to 3-3, and was set to be 1.8 millimeters in evaluation tests 3-4 to 3-6. The number of rotations of the rotary table 2 was set to be 20 rpm in the evaluation tests 3-1 and 3-4, 60 rpm in the evaluation tests 3-2 and 3-5, and 120 rpm in the evaluation tests 3-3 and 3-6. Conditions set for the film forming process were the temperature of the wafer W of 600 degrees C., a pressure in the vacuum chamber 11 of 1.8 Torr (240.0 Pa), a flow rate of the source gas of 200 sccm (0.34 Pa·m³/sec), a flow rate of the $O_3$ gas as the oxidizing gas of 6 slm (1.01 Pa·m³/sec), a flow rate of the $N_2$ gas from the center area forming portion C of 0 sccm, and a time for performing the film forming process of 10 min.

Figure 28A:
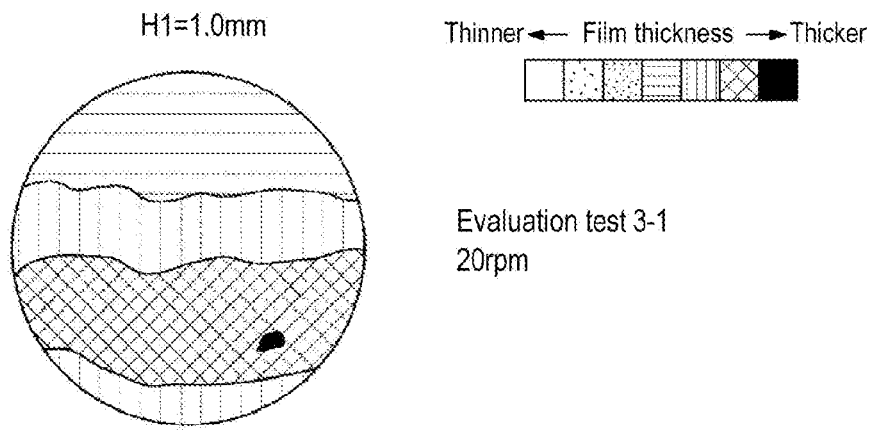
FIGS. 28A to 28C and 29A to 29C are schematic diagrams for illustrating a distribution of film thickness on a wafer obtained from an evaluation test.
Figure 28B:
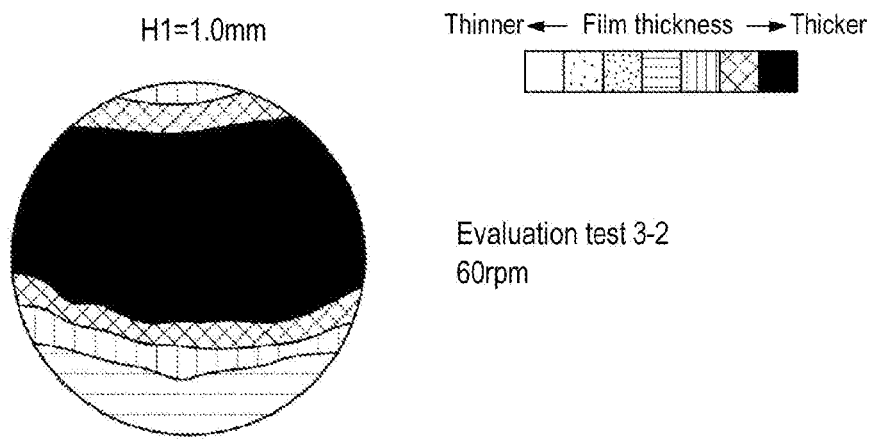
Figure 28C:
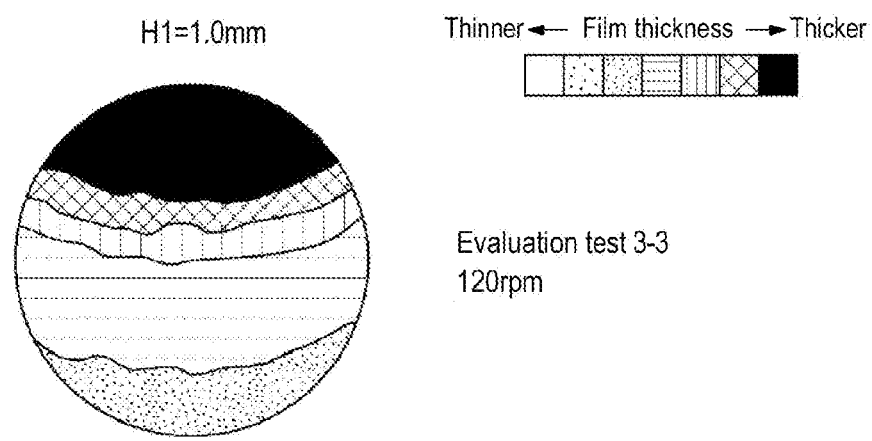
Figure 29A:
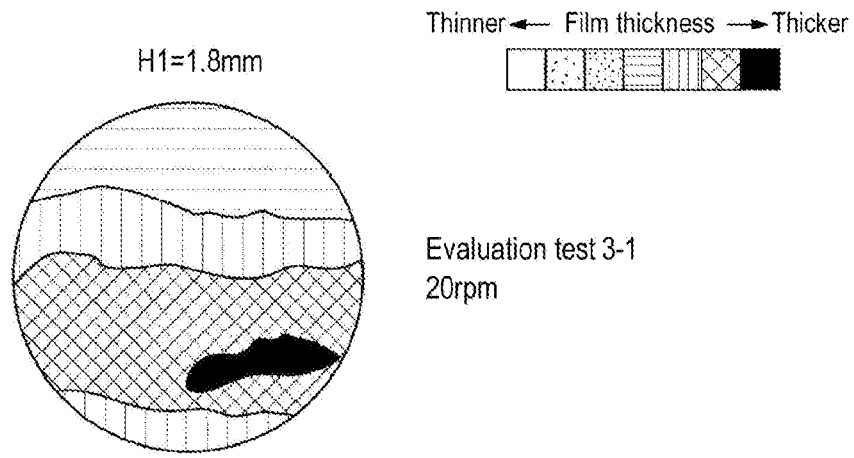
Figure 29B:
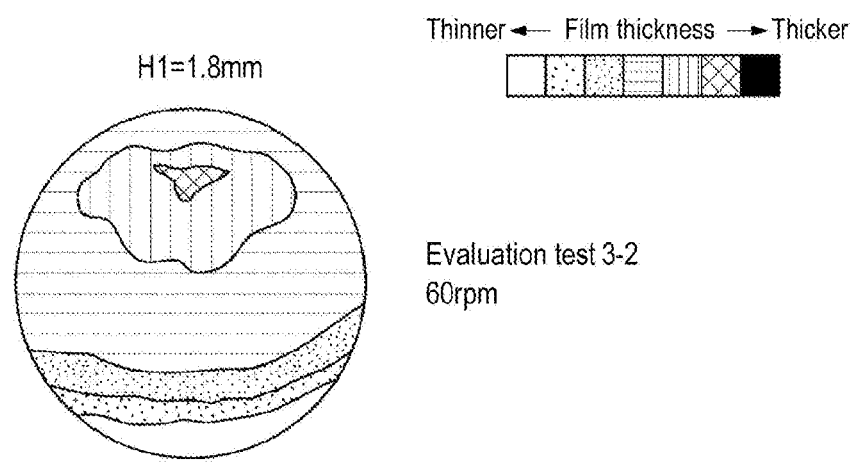
Figure 29C:
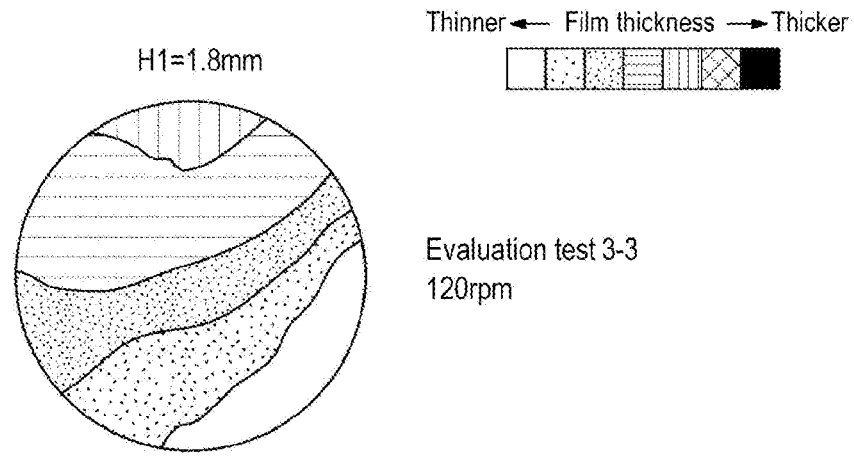
Figure 30A:
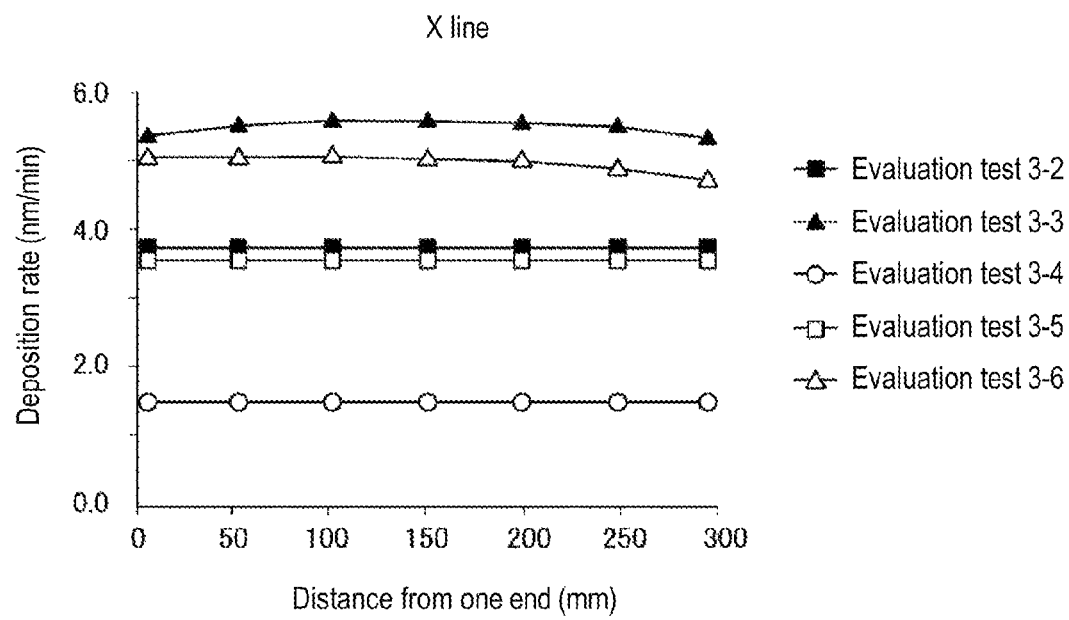
FIGS. 30A and 30B are graphs showing a distribution of film thickness on a wafer obtained from evaluation tests.
Figure 30B:
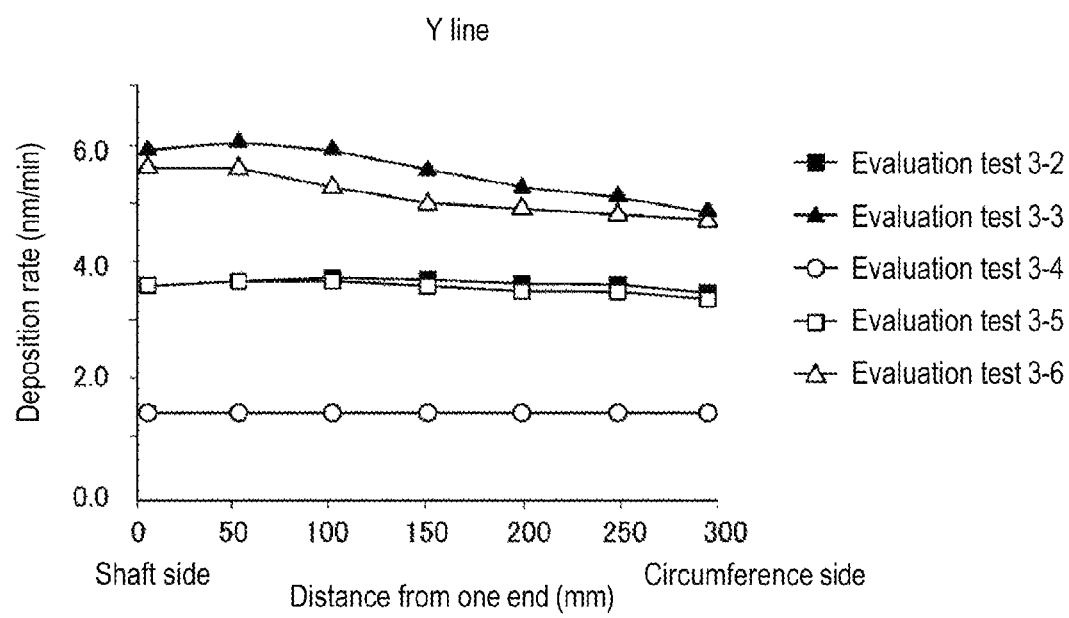

FIGS. 28A to 28C schematically show images of the distribution of the film thickness on the wafer W obtained in the evaluation tests 3-1, 3-2, and 3-3, respectively, in the same manner as FIGS. 20A to 21B in the evaluation test 1. FIGS. 29A to 29C schematically show images of the distribution of the film thickness on the wafer W obtained in the evaluation tests 3-1, 3-2, and 3-3, respectively, like FIGS. 28A to 28C. FIGS. 30A and 30B show graphs of the distributions of the film thickness of the X line and the Y line, respectively, in the evaluation tests 3-2 to 3-6. The horizontal axis and the vertical axis of each of the graphs of FIGS. 30A and 30B represent the distance from an end of the wafer W and the deposition rate, respectively, like the horizontal axis and the vertical axis of each of the graphs of FIGS. 26A to 27B in the evaluation test 2. The distributions of the film thickness of the X line and the Y line in the evaluation test 3-1 showed substantially the same result as those of the evaluation test 3-4, and an indication thereof is omitted from the graph.

From the above graphs and schematic diagrams, it is found that the film thickness of a part of the peripheral portion of the wafer W was thinner than the film thickness of the other area in the evaluation tests 3-5 and 3-6 in which the number of rotations of the rotary table 2 is relatively high and the height H1 of the side wall of the recess portion 25 is set to be 1.8 millimeters. It is estimated that, since the distribution gradient of the film thickness is made even along the circumferential direction of the wafer W by the rotation of the wafer W, the film thickness of the peripheral portion in the entire circumference of the wafer W can be decreased by setting the height H1 of the side wall of the recess portion in the above-described manner, rotating the wafer W, and setting the number of rotations of the rotary table 2 to be relatively high.

According to the present disclosure, the rotation speed of the substrate is calculated based on the parameter including the rotation speed of the rotary table, and then the substrate is rotated at the calculated rotation speed. This enables the orientation of the substrate to be surely changed whenever the substrate is located in the gas supply region over the rotary table. Hence the film can be formed with a highly uniform thickness in the circumferential direction of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a thin film on a plurality of substrates by supplying a processing gas to the plurality of substrates, the method comprising:
    loading the plurality of substrates on a plurality of loading areas formed at a first surface side of a rotary table disposed in a vacuum chamber and revolving the plurality of substrates;
    rotating the plurality of loading areas by a rotation mechanism to rotate the plurality of substrates;
    supplying the processing gas to a processing gas supply area at the first surface side of the rotary table by a processing gas supply mechanism so that the thin film is formed on the plurality of substrates which repeatedly passes through the processing gas supply area by a plurality of times;
    calculating a rotation speed of the plurality of substrates based on a parameter including a rotation speed of the rotary table to allow an orientation of the plurality of substrates to be changed whenever the plurality of substrates is positioned in the processing gas supply area; and
    rotating the plurality of substrates at a calculated rotation speed,
    wherein the rotation mechanism includes a plurality of rotation shafts installed at a second surface side of the rotary table and revolving by a rotation of the rotary table,
    the plurality of rotation shafts is supported against the rotary table by a support member installed at the second surface side of the rotary table,
    the support member includes:
        a plurality of struts installed at the second surface side of the rotary table and separated from each other along a rotational direction of the rotary table with respect to the plurality of rotation shafts;
        a support ring configured to connect the rotation mechanism to the plurality of struts by coupling the plurality of struts to the rotation mechanism at a lower side of a heater installed along the rotational direction of the rotary table on an inner side and an outer side of a traveling path of the plurality of the rotation shafts and the support member; and
        a shield ring disposed to be overlapped with the support ring,
    the rotation mechanism includes a plurality of rotation driving parts disposed in a lower side of the support ring,
    each of the plurality of rotation shafts is coupled to each of the plurality of rotation driving parts,
    the method further comprises heating the rotary table from the second surface side by the heater, and
    each of the plurality of rotation shafts and each of the plurality of struts are alternately arranged to penetrate the shield ring along the rotational direction of the rotary table.

2. The method according to claim 1, wherein the calculating includes a calculation of a product of (i) the rotation speed of the rotary table and (ii) a value obtained from a division of an increase amount of film thickness per rotation of the rotary table by a target film thickness.

3. The method according to claim 2, wherein the calculating includes a calculation of a product of (i) the rotation speed of the rotary table, (ii) the value obtained from the division of the increase amount of film thickness per rotation of the rotary table by the target film thickness, and (iii) a natural number equal to or larger than one,
    the method further comprising setting the natural number.

4. The method according to claim 1, wherein the rotating the loading area includes:
    revolving a first rotating member including a magnet together with the loading area;
    intermittently rotating the first rotating member in a non-contacting manner by a magnetic force between the first rotating member and a second rotating member constituting the rotation mechanism and including a magnet; and rotating the loading area by a rotation of the first rotating member.

5. A non-transitory computer-readable recording medium storing therein a computer program used in a film forming apparatus in which a thin film is formed on a plurality of substrates by supplying a processing gas to the plurality of substrates, wherein the computer program is configured to execute the method according to claim 1.

* * * * *